(12) United States Patent
Feng et al.

(10) Patent No.: US 11,244,595 B2
(45) Date of Patent: Feb. 8, 2022

(54) SHIFT REGISTER UNIT COMPRISING INPUT CIRCUIT, FIRST CONTROL CIRCUIT, BLANKING CONTROL CIRCUIT, FIRST OUTPUT CIRCUIT, AND SECOND OUTPUT CIRCUIT, DRIVING METHOD, GATE DRIVING CIRCUIT, AND DISPLAY DEVICE

(71) Applicants: HEFEI BOE JOINT TECHNOLOGY CO., LTD., Hefei (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/957,161

(22) PCT Filed: Aug. 8, 2019

(86) PCT No.: PCT/CN2019/099801
§ 371 (c)(1),
(2) Date: Jun. 23, 2020

(87) PCT Pub. No.: WO2021/022554
PCT Pub. Date: Feb. 11, 2021

(65) Prior Publication Data
US 2021/0201751 A1    Jul. 1, 2021

(51) Int. Cl.
*G09G 5/00* (2006.01)
*G09G 3/20* (2006.01)
(Continued)

(52) U.S. Cl.
CPC ......... *G09G 3/2092* (2013.01); *G09G 3/3266* (2013.01); *G09G 3/3677* (2013.01);
(Continued)

(58) Field of Classification Search
CPC ......... G09G 3/2092; G09G 2310/0286; G09G 2310/08; G09G 2310/061;
(Continued)

(56) References Cited

U.S. PATENT DOCUMENTS

| 9,293,093 B2 | 3/2016 | Kim et al. | |
|---|---|---|---|
| 2008/0187089 A1* | 8/2008 | Miyayama | G11C 19/28 377/79 |

(Continued)

FOREIGN PATENT DOCUMENTS

| CN | 106023933 A | 10/2016 |
|---|---|---|
| CN | 108682397 A | 10/2018 |

(Continued)

*Primary Examiner* — Adam J Snyder
(74) *Attorney, Agent, or Firm* — Dilworth & Barrese, LLP.; Michael J. Musella, Esq.

(57) ABSTRACT

A shift register unit, a gate driving circuit, a display device, and a driving method are provided. The shift register unit includes an input circuit, a first control circuit, a blanking control circuit, a first output circuit, and a second output circuit. The input circuit is configured to control a level of a first node in response to an input signal input; the first control circuit is configured to control a level of the second node in response to the input signal and the level of the first node; the blanking control circuit is configured to control the level of the first node and the level of the second node; the first output circuit is configured to output a first output signal at the first output terminal; and the second output circuit is configured to output a second output signal at the second output terminal.

27 Claims, 9 Drawing Sheets

(51) Int. Cl.
 G09G 3/3266 (2016.01)
 G09G 3/36 (2006.01)
 G11C 19/28 (2006.01)

(52) U.S. Cl.
 CPC ............... *G09G 2300/0426* (2013.01); *G09G 2310/0286* (2013.01); *G09G 2310/061* (2013.01); *G09G 2310/08* (2013.01); *G11C 19/28* (2013.01)

(58) Field of Classification Search
 CPC ......... G09G 2300/0426; G09G 3/3266; G09G 3/3677; G11C 19/28
 See application file for complete search history.

(56) References Cited

U.S. PATENT DOCUMENTS

| | | | |
|---|---|---|---|
| 2015/0036784 A1* | 2/2015 | Qing | G09G 3/3208 377/68 |
| 2016/0049107 A1* | 2/2016 | Hsu | G09G 3/20 345/212 |
| 2017/0186352 A1* | 6/2017 | Lin | G09G 3/20 |
| 2018/0190228 A1 | 7/2018 | Xu et al. | |
| 2018/0337682 A1* | 11/2018 | Takasugi | G09G 3/3266 |
| 2020/0035316 A1 | 1/2020 | Feng et al. | |

FOREIGN PATENT DOCUMENTS

| | | |
|---|---|---|
| CN | 108806597 A | 11/2018 |
| CN | 109166527 A | 1/2019 |
| CN | 109166529 A | 1/2019 |
| CN | 109935187 A | 6/2019 |
| CN | 109935199 A | 6/2019 |
| KR | 20170078978 A | 7/2017 |

* cited by examiner

SHIFT REGISTER UNIT COMPRISING INPUT CIRCUIT, FIRST CONTROL CIRCUIT, BLANKING CONTROL CIRCUIT, FIRST OUTPUT CIRCUIT, AND SECOND OUTPUT CIRCUIT, DRIVING METHOD, GATE DRIVING CIRCUIT, AND DISPLAY DEVICE

TECHNICAL FIELD

The embodiments of the present disclosure relate to a shift register unit and a driving method, a gate driving circuit, and a display device.

BACKGROUND

In a field of display technology, for example, a pixel array of a liquid crystal display panel or an organic light-emitting diode (OLED) display panel generally comprises a plurality of rows of gate lines and a plurality of columns of data lines interleaved with the plurality of rows of gate lines. The gate lines can be driven by a gate driving circuit. The gate driving circuit is usually integrated in a gate driving chip (Gate IC).

SUMMARY

At least one embodiment of the present disclosure provides s shift register unit, comprising: an input circuit, a first control circuit, a blanking control circuit, a first output circuit, and a second output circuit. The input circuit is connected to an input terminal and is configured to control a level of a first node in response to an input signal input from the input terminal; the first control circuit is connected to the input terminal, the first node, and a second node, and is configured to control a level of the second node in response to the input signal input from the input terminal and the level of the first node; the blanking control circuit is connected to the first node and the second node, and is configured to control the level of the first node and the level of the second node under control of a selection control signal, a first clock signal, and the level of the first node; the first output circuit comprises a first output terminal, and the first output circuit is configured to output a first output signal at the first output terminal under control of the level of the first node; and the second output circuit comprises a second output terminal, and the second output circuit is configured to output a second output signal at the second output terminal under control of the level of the second node.

For example, in the shift register unit provided by at least one embodiment of the present disclosure, the blanking control circuit comprises a first control sub-circuit, a second control sub-circuit, and a third control sub-circuit; the first control sub-circuit is connected to the first node and a first blanking node, and is configured to control a level of the first blanking node under control of the selection control signal and the level of the first node; the second control sub-circuit is connected to the first blanking node and a second blanking node, and is configured to control a level of the second blanking node under control of the level of the first blanking node; and the third control sub-circuit is connected to the second blanking node, the first node, and the second node, and is configured to control the level of the first node and the level of the second node under control of the first clock signal.

For example, in the shift register unit provided by at least one embodiment of the present disclosure, the first control sub-circuit comprises a first transistor and a first capacitor, the second control sub-circuit comprises a second transistor, and the third control sub-circuit comprises a third transistor and a fourth transistor; a gate electrode of the first transistor is connected to a selection control terminal to receive the selection control signal, a first electrode of the first transistor is connected to the first node, and a second electrode of the first transistor is connected to the first blanking node; a first electrode of the first capacitor is connected to the first blanking node, and a second electrode of the first capacitor is connected to a first voltage terminal to receive a first voltage; a gate electrode of the second transistor is connected to the first blanking node, a first electrode of the second transistor is connected to a first clock signal terminal to receive the first clock signal, and a second electrode of the second transistor is connected to the second blanking node; a gate electrode of the third transistor is connected to the first clock signal terminal to receive the first clock signal, a first electrode of the third transistor is connected to the second blanking node, and a second electrode of the third transistor is connected to the first node; a gate electrode of the fourth transistor is connected to the first clock signal terminal to receive the first clock signal, a first electrode of the fourth transistor is connected to the second blanking node, and a second electrode of the fourth transistor is connected to the second node.

For example, in the shift register unit provided by at least one embodiment of the present disclosure, the first output terminal comprises a shift output terminal and at least one scan signal output terminal.

For example, in the shift register unit provided by at least one embodiment of the present disclosure, in a case where the first output terminal comprises a shift output terminal and a scan signal output terminal, the first output circuit comprises a fifth transistor, a sixth transistor, and a second capacitor; a gate electrode of the fifth transistor is connected to the first node, a first electrode of the fifth transistor is connected to a second clock signal terminal to receive a second clock signal as the first output signal, and a second electrode of the fifth transistor is connected to the shift output terminal; a gate electrode of the sixth transistor is connected to the first node, a first electrode of the sixth transistor is connected to a third clock signal terminal to receive a third clock signal as the first output signal, and a second electrode of the sixth transistor is connected to the scan signal output terminal; a first electrode of the second capacitor is connected to the first node, and a second electrode of the second capacitor is connected to the second electrode of the fifth transistor or the second electrode of the sixth transistor, a time sequence of the second clock signal in a display period is identical with a time sequence of the third clock signal in the display period.

For example, in the shift register unit provided by at least one embodiment of the present disclosure, the second output circuit comprises a seventh transistor and a third capacitor; a gate electrode of the seventh transistor is connected to the second node, a first electrode of the seventh transistor is connected to a fourth clock signal terminal to receive a fourth clock signal as the second output signal, and a second electrode of the seventh transistor is connected to the second output terminal; a first electrode of the third capacitor is connected to the second node, and a second electrode of the third capacitor is connected to the second output terminal.

For example, in the shift register unit provided by at least one embodiment of the present disclosure, the input circuit comprises an eighth transistor, a gate electrode of the eighth transistor is connected to the input terminal to receive the input signal, a first electrode of the eighth transistor is connected to a second voltage terminal to receive a second voltage, and a second electrode of the eighth transistor is connected to the first node.

For example, in the shift register unit provided by at least one embodiment of the present disclosure, the first control circuit comprises a ninth transistor, a gate electrode of the ninth transistor is connected to the input terminal to receive the input signal, a first electrode of the ninth transistor is connected to the first node, and a second electrode of the ninth transistor is connected to the second node.

For example, the shift register unit provided by at least one embodiment of the present disclosure further comprises: a second control circuit and a third control circuit, the second control circuit is connected to the first node and a third node, and is configured to control a level of the third node under control of the level of the first node; and the third control circuit is connected to the second node and a fourth node, and is configured to control a level of the fourth node under control of the level of the second node.

For example, in the shift register unit provided by at least one embodiment of the present disclosure, the second control circuit comprises a tenth transistor and an eleventh transistor, and the third control circuit comprises a twelfth transistor and a thirteenth transistor; a gate electrode of the tenth transistor is connected to a first electrode of the tenth transistor, and is connected to a second voltage terminal to receive a second voltage, and a second electrode of the tenth transistor is connected to the third node; a gate electrode of the eleventh transistor is connected to the first node, a first electrode of the eleventh transistor is connected to the third node, and a second electrode of the eleventh transistor is connected to a first voltage terminal to receive a first voltage; a gate electrode of the twelfth transistor is connected to a first electrode of the twelfth transistor and is connected to the second voltage terminal to receive the second voltage, and a second electrode of the twelfth transistor is connected to the fourth node; and a gate electrode of the thirteenth transistor is connected to the second node, a first electrode of the thirteenth transistor is connected to the fourth node, and a second electrode of the thirteenth transistor is connected to the first voltage terminal to receive the first voltage.

For example, the shift register unit provided by at least one embodiment of the present disclosure further comprises: a first node noise reduction circuit and a second node noise reduction circuit; the first node noise reduction circuit is connected to the first node and the third node, and is configured to perform noise reduction on the first node under control of the level of the third node; the second node noise reduction circuit is connected to the second node and the fourth node, and is configured to perform noise reduction on the second node under control of the level of the fourth node.

For example, in the shift register unit provided by at least one embodiment of the present disclosure, the first node noise reduction circuit comprises a fourteenth transistor, and the second node noise reduction circuit comprises a fifteenth transistor; a gate electrode of the fourteenth transistor is connected to the third node, a first electrode of the fourteenth transistor is connected to the first node, and a second electrode of the fourteenth transistor is connected to a first voltage terminal to receive a first voltage; a gate electrode of the fifteenth transistor is connected to the fourth node, a first electrode of the fifteenth transistor is connected to the second node, and a second electrode of the fifteenth transistor is connected to the first voltage terminal to receive the first voltage.

For example, the shift register unit provided by at least one embodiment of the present disclosure further comprises: a first output noise reduction circuit and a second output noise reduction circuit; the first output noise reduction circuit is connected to the third node and the first output terminal, and is configured to perform noise reduction on the first output terminal under the control of the level of the third node; and the second output noise reduction circuit is connected to the fourth node and the second output terminal, and is configured to perform noise reduction on the second output terminal under the control of the level of the fourth node.

For example, in the shift register unit provided by at least one embodiment of the present disclosure, in a case where the first output terminal comprises a shift output terminal and a scan signal output terminal, the first output noise reduction circuit comprises a sixteenth transistor and a seventeenth transistor, and the second output noise reduction circuit comprises an eighteenth transistors; a gate electrode of the sixteenth transistor is connected to the third node, a first electrode of the sixteenth transistor is connected to the shift output terminal, and a second electrode of the sixteenth transistor is connected to a first voltage terminal to receive a first voltage; a gate electrode of the seventeenth transistor is connected to the third node, a first electrode of the seventeenth transistor is connected to the scan signal output terminal, and a second electrode of the seventeenth transistor is connected to a third voltage terminal to receive a third voltage; and a gate electrode of the eighteenth transistor is connected to the fourth node, a first electrode of the eighteenth transistor is connected to the second output terminal, and a second electrode of the eighteenth transistor is connected to the third voltage terminal to receive the third voltage.

For example, the shift register unit provided by at least one embodiment of the present disclosure further comprises: a first reset circuit and a second reset circuit, the first reset circuit is connected to the first node and a first reset terminal, and is configured to reset the first node in response to a first reset signal provided by the first reset terminal; and the second reset circuit is connected to the second node and the first reset terminal, and is configured to reset the second node in response to the first reset signal.

For example, in the shift register unit provided by at least one embodiment of the present disclosure, the first reset circuit comprises a nineteenth transistor, and the second reset circuit comprises a twentieth transistor; a gate electrode of the nineteenth transistor is connected to the first reset terminal to receive the first reset signal, a first electrode of the nineteenth transistor is connected to the first node, and a second electrode of the nineteenth transistor is connected to a first voltage terminal to receive a first voltage; a gate electrode of the twentieth transistor is connected to the first reset terminal to receive the first reset signal, a first electrode of the twentieth transistor is connected to the second node, and a second electrode of the twentieth transistor is connected to the first voltage terminal to receive the first voltage.

For example, in the shift register unit provided by at least one embodiment of the present disclosure further comprises: a first total reset circuit and a second total reset circuit, the first total reset circuit is connected to the first node and a second reset terminal, and is configured to reset the first node in response to a second reset signal provided by the second reset terminal; and the second total reset circuit is connected to the second node and the second reset terminal, and is configured to reset the second node in response to the second reset signal.

For example, in the shift register unit provided by at least one embodiment of the present disclosure, the first total reset circuit comprises a twenty-first transistor, and the second total reset circuit comprises a twenty-second transistor; a gate electrode of the twenty-first transistor is connected to the second reset terminal to receive the second reset signal, a first electrode of the twenty-first transistor is connected to the first node, and a second electrode of the twenty-first transistor is connected to the first voltage terminal to receive the first voltage; and a gate electrode of the twenty-second transistor is connected to the second reset terminal to receive the second reset signal, a first electrode of the twenty-second transistor is connected to the second node, and a second electrode of the twenty-second transistor is connected to the first voltage terminal to receive the first voltage.

At least one embodiment of the present disclosure provides a gate driving circuit, comprising the shift register unit according to any one embodiment of the present disclosure.

At least one embodiment of the present disclosure provides a display device, comprising the gate driving circuit according to any one embodiment of the present disclosure and a plurality of sub-pixel units arranged in an array, the first output terminal and the second output terminal of each shift register unit in the gate driving circuit are electrically connected to different rows of the plurality of sub-pixel units, respectively.

At least one embodiment of the present disclosure provides a driving method for driving the shift register unit, comprises a display period and a blanking period for one frame, and during the display period, the input circuit charges the first node in response to the input signal input from the input terminal, and the first control circuit charges the second node in response to the input signal and the level of the first node, and the blanking control circuit charges the first blanking node of the blanking control circuit under control of the level of the first node; and the first output circuit outputs the first output signal at the first output terminal under control of the level of the first node, and the second output circuit outputs the second output signal at the second output terminal under control of the level of the second node; during the blanking period, the blanking control circuit charges the first node and the second node under control of the selection control signal, the first clock signal, and a level of the first blanking node; and the first output circuit outputs the first output signal at the first output terminal under control of the level of the first node, and the second output circuit outputs the second output signal at the second output terminal under control of the level of the second node.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
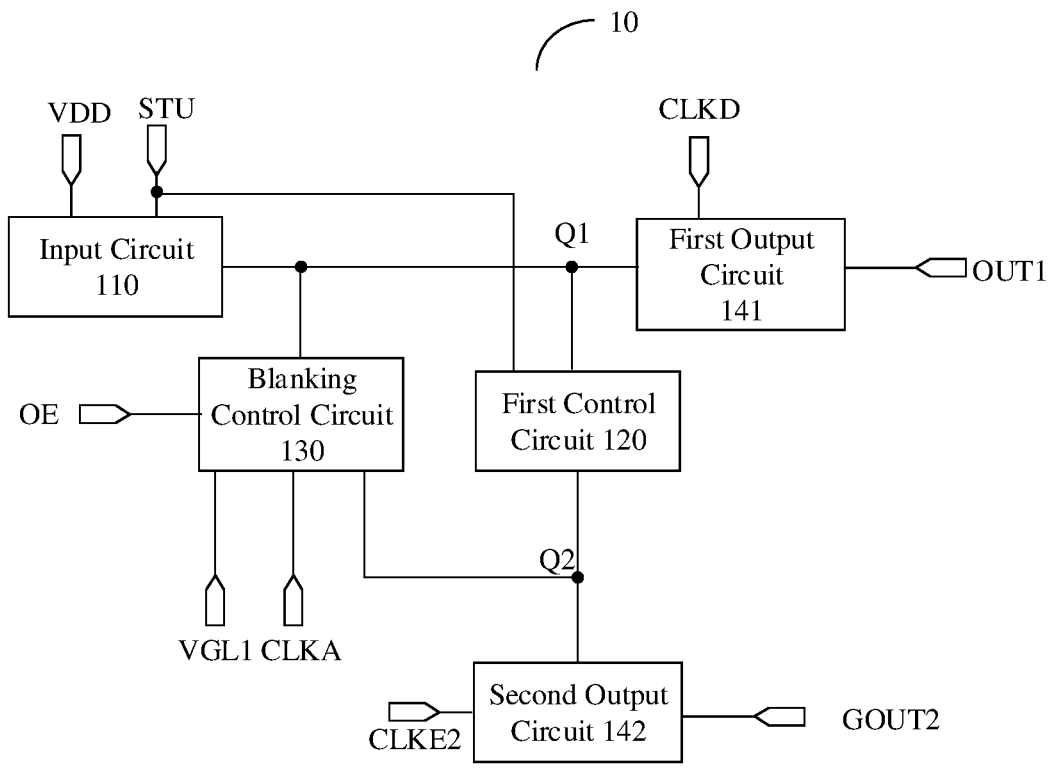
FIG. 1 is a schematic diagram of a shift register unit provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the case of compensating for a sub-pixel unit in an OLED display panel, in addition to providing a pixel compensation circuit in the sub-pixel unit for achieving internal compensation, external compensation can also be achieved by providing a sense transistor. When performing external compensation, a gate driving circuit including shift register units needs to provide respectively driving signals, which are used for a scan transistor and a sense transistor, to the sub-pixel unit in the display panel, for example, provide a scan driving signal for the scan transistor during a display period of one frame, and provide a sense driving signal for the sense transistor during a blanking period of one frame.

In an external compensation method, the sense driving signals output by the gate driving circuit is used for sequential scanning line by line, for example, a sense driving signal for sub-pixel units in a first row in the display panel is output during a blanking period of a first frame, a sense driving signal for sub-pixel units in a second row in the display panel is output during a blanking period of a second frame, and so on, the sense driving signals are sequentially output line by line according to the frequency of outputting the sense driving signal corresponding to one row of sub-pixel units each frame, namely achieving the progressive sequential compensation for the display panel.

As described above, in the case where the gate driving circuit drives a plurality of rows of sub-pixel units in a display panel, if external compensation is to be achieved, the gate driving circuit needs to not only output the scan driving signal for the display period, but also output the sense driving signal for the blanking period.

However, it is very difficult for the gate driving circuit to output two kinds of drive signals with different periods and different pulse widths during the display period and the blanking period, and furthermore, the structure of the gate driving circuit is required to be as simple as possible. Therefore, how to achieve a display device with high PPI (Pixels Per Inch) with the above-mentioned functions through as few transistors and capacitors as possible has become an urgent problem for those skilled in the art.

In view of the above problems, at least one embodiment of the present disclosure provides a shift register unit, the shift register unit includes an input circuit, a first control circuit, a blanking control circuit, a first output circuit, and a second output circuit. The input circuit is connected to an input terminal and is configured to control a level of a first node in response to an input signal input from the input terminal; the first control circuit is connected to the input terminal, the first node, and a second node, and is configured to control a level of the second node in response to the input signal input from the input terminal and the level of the first node; the blanking control circuit is connected to the first node and the second node, and is configured to control the level of the first node and the level of the second node under control of a selection control signal, a first clock signal, and the level of the first node; the first output circuit comprises a first output terminal, and the first output circuit is configured to output a first output signal at the first output terminal under control of the level of the first node; and the second output circuit comprises a second output terminal, and the second output circuit is configured to output a second output signal at the second output terminal under control of the level of the second node.

Some embodiments of the present disclosure also provide a gate driving circuit, a display device, and a driving method corresponding to the above shift register unit.

The shift register unit provided by the above embodiments of the present disclosure achieves to control the level of the first node and the level of the second node by one blanking control circuit shared by the first node and the second node, so that under the control of the level of the first node and the level of the second node, the function of outputting two driving signals for two rows of pixel circuits through one stage of shift register unit is achieved, thereby greatly reducing an amount of transistors and an amount of capacitors, decreasing the frame size of the display device using the shift register unit, reducing the cost, and improving the PPI of the display device.

It should be noted that, in the embodiments of the present disclosure, random compensation refers to an external compensation method that is different from the progressive sequential compensation, a sense driving signal corresponding to arbitrary row of sub-pixel units of the display panel may be randomly outputted during a blanking period of a certain frame, the following embodiments are the same as those described herein, and the repeated descriptions will not be repeated again.

Furthermore, in the embodiments of the present disclosure, in order to describe clearly and concisely, "one frame", "each frame", or "certain frame" includes a display period and a blanking period that are successively performed. For example, during the display period, the gate driving circuit outputs driving signals, the driving signals can drive the plurality of rows of sub-pixel units in the display panel from a first row to a last row to complete a scan display of an entire image; during the blanking period, the gate driving circuit outputs a driving signal, the driving signal can be used for driving sense transistors in a certain row of sub-pixel units in the display panel, to complete external compensation for this row of sub-pixel units.

The embodiments and examples of the present disclosure will be described in detail below with reference to the drawings.

FIG. 1 is a schematic diagram of a shift register unit provided by at least one embodiment of the present disclosure. As shown in FIG. 1, the shift register unit 10 may include an input circuit 110, a first control circuit 120, a blanking control circuit 130, a first output circuit 141, and a second output circuit 142. A gate driving circuit can be obtained by cascading a plurality of shift register units 10, the gate driving circuit is used to drive a display panel, and sequentially provide scan signals for a plurality of gate lines of the display panel, so as to perform progressive or interlaced scanning and the like during a period when the display panel displays one frame of picture.

As shown in FIG. 1, the input circuit 110 is connected to an input terminal STU, and is configured to control a level of a first node Q1 in response to an input signal input by the input terminal STU. For example, in some examples, the input circuit 110 is connected to the input terminal STU, a second voltage terminal VDD, and the first node Q1, and is configured to be turned on under the control of the input signal provided by the input terminal STU, so as to connect the second voltage terminal VDD to the first node Q1, so that a second voltage provided by the second voltage terminal VDD is input to the first node Q1 to charge a potential of the first node Q1 to a working potential (for example, a working potential is a potential that can turn on the transistor connected to the first node Q1). For example, in other examples, the input circuit 110 may be connected to the input terminal STU and the first node Q1, and is configured to be turned on under the control of the input signal provided by the input terminal STU to connect the input terminal STU to the first node Q1, and therefore, the input signal provided by the input terminal STU is input to the first node Q1 to pull up the potential of the first node Q1 to the working potential. It should be noted that the second voltage terminal VDD can also be replaced by a clock signal terminal that provides a clock signal, as long as the first node Q1 can be charged at a corresponding stage, the embodiments of the present disclosure are not limited to this case.

The first control circuit 120 is connected to the input terminal STU, the first node Q1, and a second node Q2, and is configured to control a level of the second node Q2 in response to the input signal input from the input terminal STU and the level of the first node Q1. For example, in some examples, the first control circuit 120 is connected to the input terminal STU, the first node Q1, and the second node Q2, and is configured to be turned on under the control of the input signal provided by the input terminal STU, so as to connect the second node Q2 and the first node Q1, thereby enabling a potential of the second node Q2 be consistent with the potential of the first node Q1, that is, charging the potential of the second node Q2 to the working potential through the first node Q1.

The blanking control circuit 130 is connected to the first node Q1 and the second node Q2, and is configured to control the level of the first node Q1 and the level of the second node Q2 under control of a selection control signal, a first clock signal, and the level of the first node Q1. For example, in some examples, the blanking control circuit 130 is connected to a selection control terminal OE, a first clock signal terminal CLKA, a first voltage terminal VGL1, the first node Q1, and the second node Q2, and is configured to store the level of the first node Q1 under the control of the selection control signal provided by the selection control terminal OE, and during a blanking period of one frame, under the control of the first clock signal provided by the first clock signal terminal CLKA and the stored level of the first node Q1, is configured to provide the first clock signal provided by the first clock signal terminal CLKA to the first node Q1 and the second node Q2, thereby charging the potential of the first node Q1 and the potential of the second node Q2 to the working potential. In the embodiment, on one hand, the level of the first node Q1 and the level of the second node Q2 can be controlled simultaneously by the blanking control circuit 130 shared by the first node Q1 and the second node Q2, there is no need to separately control the first node Q1 and the second node Q2 through separate circuits, respectively, thereby saving an amount of transistors in the shift register unit, reducing the frame size of the display device using the shift register unit, and reducing costs. On the other hand, the input terminal of the blanking control circuit 130 is connected to the first node Q1 instead of being connected to the blanking input terminal that controls the blanking period, that is, in the display period and the blanking period, one input circuit 110 can be shared, thereby greatly simplifying the circuit design of the shift register unit.

The first output circuit 141 includes a first output terminal OUT1, and the first output circuit 141 is configured to output a first output signal at the first output terminal OUT1 under the control of the level of the first node Q1. For example, in some examples, the first output circuit 141 is connected to the first node Q1, the first output terminal OUT1, and the second clock signal terminal CLKD, and is configured to be turned on under the control of the level of the first node Q1, so that the second clock signal provided by the second clock signal terminal CLKD is output as the first output signal to the first output terminal OUT1.

For example, in some examples, the first output terminal OUT1 includes a shift output terminal and at least one scan signal output terminal, so as to output an output signal, such as a second clock signal provided by the second clock signal terminal CLKD to the shift output terminal and the at least one scan signal output terminal, respectively, thereby improving the driving capability of the shift register unit 10. For example, in the example shown in FIG. 3, at least one scan signal output terminal includes one scan signal output terminal GOUT1. For example, the shift output terminal CR is used to provide an input signal for a next stage of shift register unit 10 and provide a reset signal for a previous stage of shift register unit, and the scan signal output terminal GOUT1 is used to provide a driving signal (for example, a scan driving signal or a sense driving signal) for pixel circuits of a row of pixel units in the display panel. For example, the shift output terminal CR and the scan signal output terminal GOUT1 may output the same output signal, or may output different output signals. It should be noted that in other examples, in the case where a plurality of scan signal output terminals are included, the respective scan signal output terminals may also output different output signals, and the specific setting depends on the actual situation, which is not limited by the embodiments of the present disclosure.

For example, some shift register units 10 (for example, the first several stages of shift register units) can be connected to a trigger signal line to receive the input signal STU provided by the trigger signal line; alternatively, some shift register units 10 (for example, the other stages of shift register units except the first several stages of shift register units) may also receive the shift signals CR output by other stages of the shift register units 10 as the input signal STU.

Figure 3:
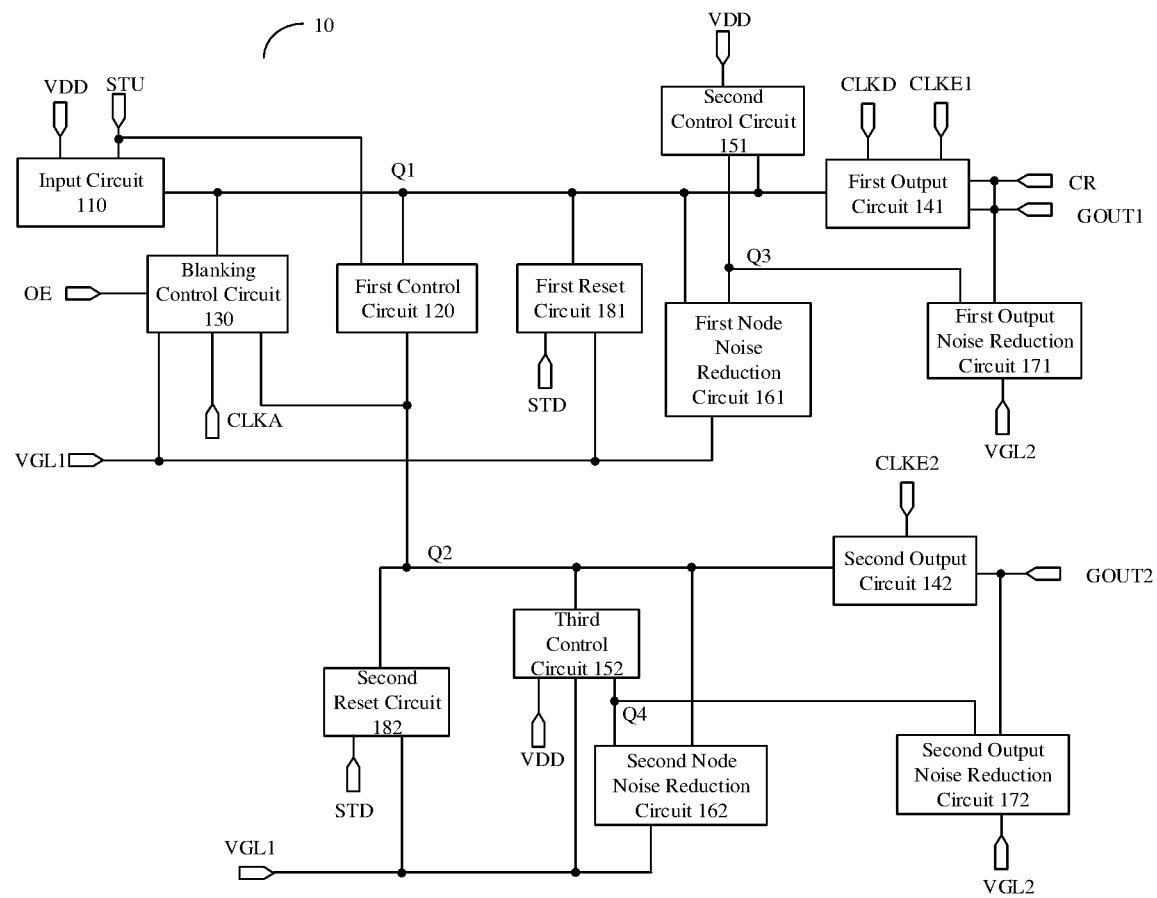
FIG. 3 is a schematic diagram of another shift register unit provided by at least one embodiment of the present disclosure.

It should be noted that in some other examples, the shift output terminal may output the first output signal only in the display period of one frame to meet the cascade requirement (of course, the first output signal may also be output in the blanking period, as long as the first output signal does not cause error display of the blanking period), in order to achieve to separately drive the scan transistor and the sense transistor in the pixel circuit, the scan signal output terminal needs to output the scan driving signal in the display period of one frame and also needs to output the sense driving signal in the blanking period of one frame. Therefore, in order to avoid the phenomenon of display disorder caused by outputting the sense driving signal that is output during the blanking period at the shift output terminal, a third clock signal terminal CLKE1 may also be included (as shown in FIG. 3). For example, the output of the scan signal output terminal GOUT1 is controlled by the third clock signal terminal CLKE1, and the output of the shift output terminal CR is controlled by the second clock signal terminal CLKD, that is, the output signals output from the scan signal output terminal GOUT1 and the shift output terminal CR are provided by different clock signal terminals, so as to avoid that the sense driving signal that is output during the blanking period is output at the shift output terminal. For example, the waveform of a third clock signal provided by the third clock signal terminal CLKE1 and the waveform of the second clock signal provided by the second clock signal terminal CLKD are completely the same during the display period, and may be the same or different during the blanking period.

The second output circuit 142 includes a second output terminal GOUT2, and the second output circuit 142 is configured to output a second output signal at the second output terminal GOUT2 under control of the level of the second node Q2. For example, in some examples, the second output circuit 142 is connected to the second node Q2, the second output terminal GOUT2, and a fourth clock signal terminal CLKE2, and is configured to be turned on under the control of the level of the second node Q2, so that a fourth clock signal provided by the fourth clock signal terminal CLKE2 is output to the second output terminal GOUT2 and serves as the second output signal.

For example, the scan signal output terminal GOUT1 in the first output terminal OUT1 and the second output terminal GOUT2 are connected to different gate lines. For example, the scan signal output terminal GOUT1 in the first output terminal OUT1 is connected to an N-th (N is an integer greater than 1) row of gate line, and the second output terminal GPUT2 is connected to an (N+1)-th row of gate line. For example, the first output signal is used as a scan driving signal or a sense driving signal transmitted by the N-th row of gate line to drive the pixel circuits connected to the N-th row of gate line. For example, the second output signal serves as a scan driving signal or a sense driving signal transmitted by the (N+1)-th row of gate line to drive the pixel circuits connected to the (N+1)-th row of gate line, and therefore, the shift register unit provided by the embodiments of the present disclosure can output driving signals for two rows of pixel circuits.

The shift register unit provided by the above embodiments of the present disclosure achieves to control the level of the first node and the level of the second node by one blanking control circuit shared by the first node and the second node, so that the function of outputting two driving signals for two rows of pixel circuits through one stage of shift register unit is achieved, thereby greatly reducing an amount of transistors and an amount of capacitors, decreasing the frame size of the display device using the shift register unit, reducing the cost, and improving the PPI of the display device.

Figure 2:
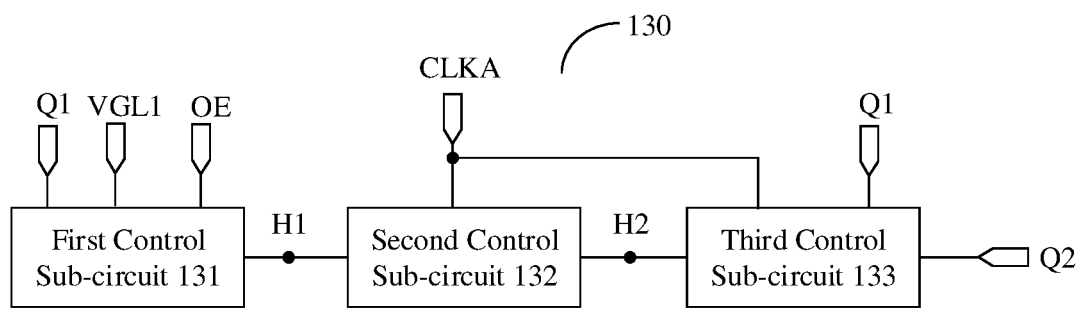
FIG. 2 is a schematic diagram of a blanking control circuit provided by at least one embodiment of the present disclosure.

FIG. 2 is a schematic diagram of an exemplary blanking control circuit provided by at least one embodiment of the present disclosure. As shown in FIG. 2, the blanking control circuit 130 includes a first control sub-circuit 131, a second control sub-circuit 132, and a third control sub-circuit 133.

The first control sub-circuit 131 is connected to the first node Q1 and a first blanking node H1, and is configured to control the level of the first blanking node H1 under the control of the selection control signal and the level of the first node Q1. For example, the first control sub-circuit 131 is connected to the first node Q1, the selection control terminal OE, the first blanking node H1, and the first voltage terminal VGL1, and is configured to be turned on under the control of the selection control signal provided by the selection control terminal OE, so that the first node Q1 is connected to the first blanking node H1, thereby writing the level of the first node Q1 to the first blanking node H1.

The second control sub-circuit 132 is connected to the first blanking node H1 and a second blanking node H2, and is configured to control a level of the second blanking node H2 under the control of the level of the first blanking node HE For example, the second control sub-circuit 132 is connected to the first clock signal terminal CLKA, the first blanking node H1, and the second blanking node H2, and is configured to be turned on under the control of the level of the first blanking node H1, so that the first clock signal terminal CLKA is connected to the second blanking node H2, thereby writing the first clock signal to the second blanking node H2.

The third control sub-circuit 133 is connected to the second blanking node H2, the first node Q1, and the second node Q2, and is configured to control the level of the first node Q1 and the level of the second node Q2 under the control of the first clock signal. For example, the third control sub-circuit 133 is connected to the first clock signal terminal CLKA, the second blanking node H2, the first node Q1, and the second node Q2, and is configured to be turned on under the control of the first clock signal provided by the first clock signal terminal CLKA, so that the first node Q1 and the second node Q2 are connected to the second blanking node H2, thereby writing the level of the second blanking node H2 into the first node Q1 and the second node Q2. For example, in the case where the first clock signal provided by the first clock signal terminal CLKA is at an effective level in the blanking period of one frame, the third control sub-circuit 133 can control the level of the first node Q1 and the level of the second node Q2 simultaneously during the blanking period to achieve the sharing of the blanking control circuit in the shift register unit driving the adjacent two rows of pixel circuits, thereby reducing an amount of transistors of the shift register unit, which is beneficial to reducing the frame size of the display device adopting the shift register unit.

FIG. 3 is a schematic diagram of another shift register unit provided by at least one embodiment of the present disclosure. As shown in FIG. 3, in the example shown in FIG. 1, the shift register unit 10 further includes a second control circuit 151 and a third control circuit 152; in other examples, the shift register unit 10 further includes a first node noise reduction circuit 161 and a second node noise reduction circuit 162; and in other examples, the shift register unit 10 further includes a first output noise reduction circuit 171 and a second output noise reduction circuit 172; in other examples, the shift register unit 10 further includes a first reset circuit 181 and a second reset circuit 182. It should be noted that the other circuit structures of the shift register unit 10 shown in FIG. 3 are basically the same as those of the shift register unit 10 shown in FIG. 1, and similar portions are not repeated here.

The second control circuit 151 is connected to the first node Q1 and the third node Q3, and is configured to control the level of the third node Q3 under the control of the level of the first node Q1. For example, in some examples, the second control circuit 151 is configured to receive the second voltage VDD and the first voltage VGL1. For example, in the case where the first node Q1 is at a high level, the second control circuit 151 may pull down the third node Q3 to a low level using the low-level first voltage VGL1. For another example, in the case where the potential of the first node Q1 is at a low level, the second control circuit 151 may charge the third node Q3 with the second voltage VDD (for example, a high level) to pull up the third node Q3 to a high level.

The third control circuit 152 is connected to the second node Q2 and a fourth node Q4, and is configured to control a level of the fourth node Q4 under the control of the level of the second node Q2. For example, in some examples, the third control circuit 152 is configured to receive the second voltage VDD and the first voltage VGL1. For example, in the case where the second node Q2 is at a high level, the third control circuit 152 may pull down the fourth node Q4 to a low level using the low-level first voltage VGL1. For another example, in the case where the potential of the second node Q2 is at a low level, the third control circuit 152 may charge the fourth node Q4 with the second voltage VDD (for example, a high level) to pull up the fourth node Q4 to a high level.

The first node noise reduction circuit 161 is connected to the first node Q1 and the third node Q3, and is configured to perform noise reduction on the first node Q1 under the control of the level of the third node Q3. For example, in some examples, the first node noise reduction circuit 161 is connected to the first voltage terminal VGL1, the first node Q1, and the third node Q3, and is configured to be turned on under the control of the level of the third node Q3, so as to connect the first node Q1 to the first voltage terminal VGL1, so that the first voltage VGL1 can be used to pull down (e.g., discharge) the first node Q1 to achieve noise reduction.

The second node noise reduction circuit 162 is connected to the second node Q2 and the fourth node Q4, and is configured to perform noise reduction on the second node Q2 under the control of the level of the fourth node Q4. For example, in some examples, the second node noise reduction circuit 162 is connected to the first voltage terminal VGL1, the second node Q2, and the fourth node Q4, and is configured to be turned on under the control of the level of the fourth node Q4, so as to connect the second node Q2 to the first voltage terminal VGL1, so that the first voltage VGL1 can be used to pull down the second node Q2 to achieve noise reduction.

The first output noise reduction circuit 171 is connected to the third node Q3 and the first output terminal OUT1 (for example, the first output terminal OUT1 includes the shift output terminal CR and the scan signal output terminal GOUT1), and is configured to perform noise reduction on the first output terminal OUT1 under the control of the level of the third node Q3. For example, in some examples, the first output noise reduction circuit 171 is connected to the third voltage terminal VGL2, the third node Q3, and the first output terminal OUT1, and is configured to be turned on under the control of the level of the third node Q3, so as to connect the first output terminal OUT1 to the third voltage terminal VGL2, so that the third voltage VGL2 can be used to pull down (e.g., discharge) the first output terminal OUT1 to achieve noise reduction.

The second output noise reduction circuit 172 is connected to the fourth node Q4 and the second output terminal GOUT2, and is configured to perform noise reduction on the second output terminal GOUT2 under the control of the level of the fourth node Q4. For example, in some examples, the second output noise reduction circuit 172 is connected to the third voltage terminal VGL2, the fourth node Q4, and the second output terminal GOUT2, and is configured to be turned on under the control of the level of the fourth node Q4, so as to connect the second output terminal GOUT2 to the third voltage terminal VGL2, so that the third voltage VGL2 can be used to pull down (e.g., discharge) the second output terminal GOUT2 to achieve noise reduction.

It should be noted that, in some embodiments of the present disclosure, the first voltage VGL1 may also be used to perform pull-down reset on the first output terminal OUT1 and the second output terminal GOUT2, and the present disclosure do not limit this. In addition, in the embodiments of the present disclosure, the third voltage VGL2 is, for example, a low level, and the following embodiments are the same as those described here and similar portions will not be described in detail below. In the embodiments of the present disclosure, the third voltage VGL2 may be the same as or may be different from the first voltage VGL1.

The first reset circuit 181 is connected to the first node Q1 and a first reset terminal STD, and is configured to reset the first node Q1 in response to a first reset signal provided by the first reset terminal STD. For example, in some examples, in the display period of one frame, the first reset circuit 181 is turned on in response to the first reset signal STD, so that the first voltage VGL1 can be used to pull down and reset the first node Q1. For example, in the case where a plurality of shift register units 10 are cascaded to form a gate driving circuit, a certain stage of shift register unit 10 may receive the shift signal CR output from another stage of shift register unit 10 as the first reset signal STD.

The second reset circuit 182 is connected to the second node Q2 and the first reset terminal STD, and is configured to reset the second node Q2 in response to the first reset signal. For example, the working principle of the second reset circuit 182 is similar to the working principle of the first reset circuit 181, and will not be repeated here.

Figure 4:
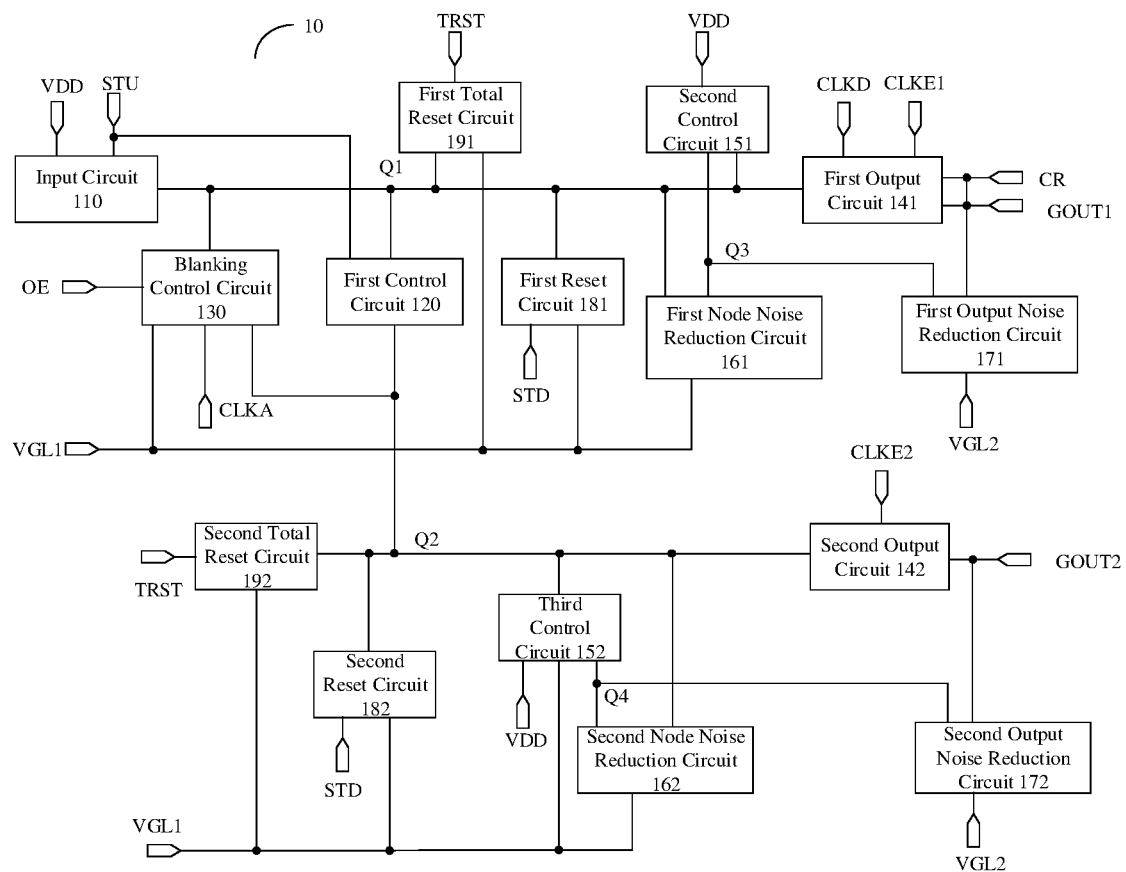
FIG. 4 is a schematic diagram of still another shift register unit provided by at least one embodiment of the present disclosure.

FIG. 4 is a schematic diagram of still another shift register unit provided by at least one embodiment of the present disclosure. As shown in FIG. 4, on the basis of the example shown in FIG. 3, the shift register unit 10 further includes a first total reset circuit 191 and a second total reset circuit 192. It should be noted that the other circuit structures of the shift register unit 10 shown in FIG. 4 are basically the same as those of the shift register unit 10 shown in FIG. 3, and the similar portions are not repeated here.

The first total reset circuit 191 is connected to the first node Q1 and a second reset terminal TRST, and is configured to reset the first node Q1 in response to a second reset signal provided by the second reset terminal TRST. For example, in the case where a plurality of shift register units 10 are cascaded to form a gate driving circuit, before the display period of one frame or after the blanking period of one frame, the first total reset circuits 191 in the respective stage of shift register units 10 are turned on in response to the second reset signal TRST, so that the fourth voltage terminal VGL1 is connected to the first node Q1, and therefore, the low-level fourth voltage VGL1 can be used to pull down and reset the first node Q1, thereby achieving a global reset of the gate driving circuit 20.

The second total reset circuit 192 is connected to the second node Q2 and the second reset terminal TRST, and is configured to reset the second node Q2 in response to the second reset signal. For example, the working principle of the second total reset circuit 192 is similar to the working principle of the first total reset circuit 191, and details are not described herein again.

Those skilled in the art can understand that although a plurality of control circuits and a plurality of reset circuits are shown in FIGS. 1-4, the above examples do not limit the protection scope of the present disclosure. In actual applications, a skilled person can choose to use or not use one or more of the above circuits according to the situation. Various combinations and modifications based on the foregoing circuits do not deviate from the principles of the present disclosure and will not be repeated here.

For other structures of the shift register unit shown in FIG. 4, reference may be made to the related description of FIG. 3, and details are not repeated here.

Figure 5:
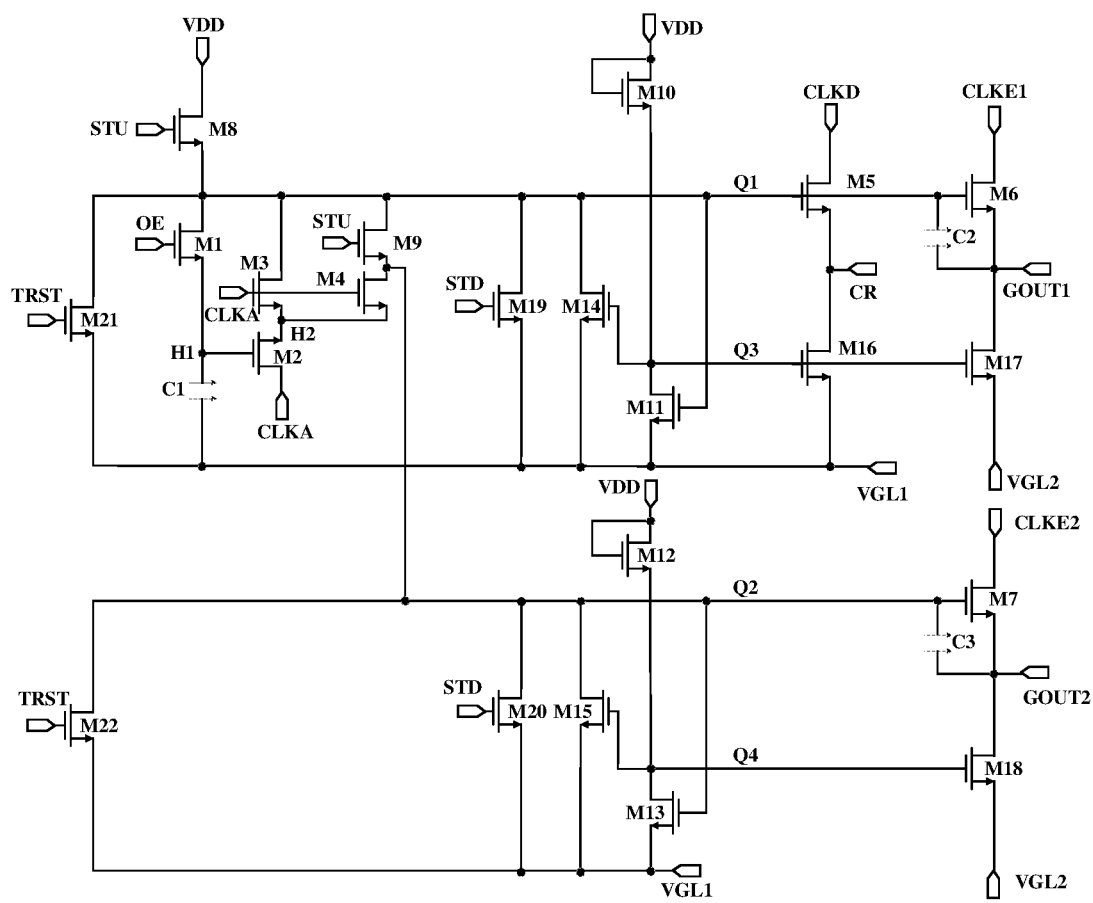
FIG. 5 is a circuit diagram of a specific implementation example of the shift register unit as shown in FIG. 4.

In some embodiments of the present disclosure, the shift register unit 10 shown in FIG. 4 may be implemented as the circuit structure shown in FIG. 5. As shown in FIG. 5, the shift register unit 10 includes: a first transistor M1 to a twenty-second transistor M22, a first capacitor C1, a second capacitor C2, and a third capacitor C3. It should be noted that the transistors shown in FIG. 5 are all described using N-type transistors as an example. The embodiments of the present disclosure are not limited to this case. For example, at least part of the transistors in the shift register unit 10 may also be P-type transistors.

As shown in FIG. 5, the input circuit 110 includes an eighth transistor M8. A gate electrode of the eighth transistor M8 is connected to the input terminal STU to receive the input signal, a first electrode of the eighth transistor M8 is connected to the second voltage terminal VDD to receive the second voltage, and a second electrode of the eighth transistor M8 is connected to the first node Q1.

Figure 6:
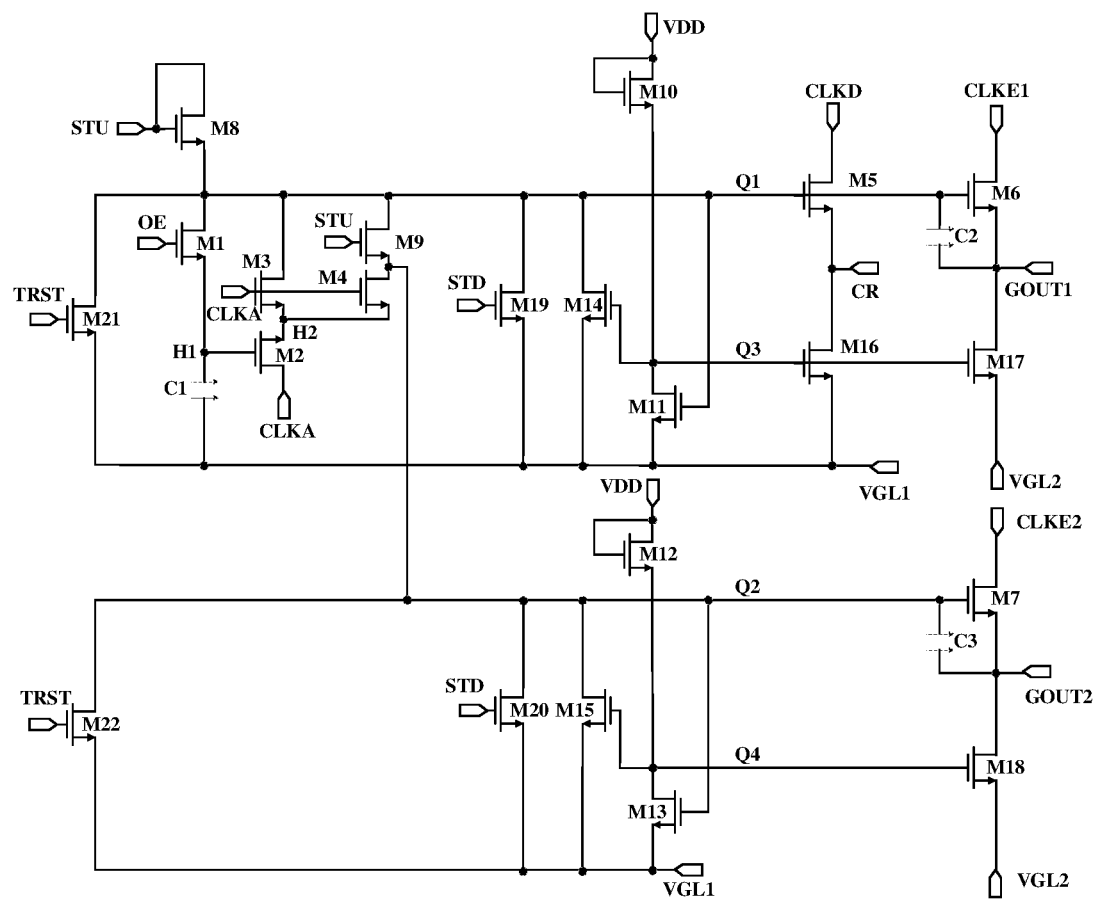
FIG. 6 is a circuit diagram of another specific implementation example of the shift register unit as shown in FIG. 4.

For example, in other examples, as shown in FIG. 6, a gate electrode and a first electrode of the eighth transistor M8 are electrically connected and are configured to receive the input signal STU, so that in the case where the input signal STU is at a high level, the high-level input signal STU is used to charge the first node Q1.

As shown in FIG. 5, in the case where the first output terminal OUT1 includes a shift output terminal CR and one scan signal output terminal GOUT1, the first output circuit 141 includes a fifth transistor M5, a sixth transistor M6, and a second capacitor C2.

A gate electrode of the fifth transistor M5 is connected to the first node Q1, a first electrode of the fifth transistor M5 is connected to the second clock signal terminal CLKD to receive the second clock signal as the first output signal, and a second electrode of the fifth transistor M5 is connected to the shift output terminal CR.

Figure 7:
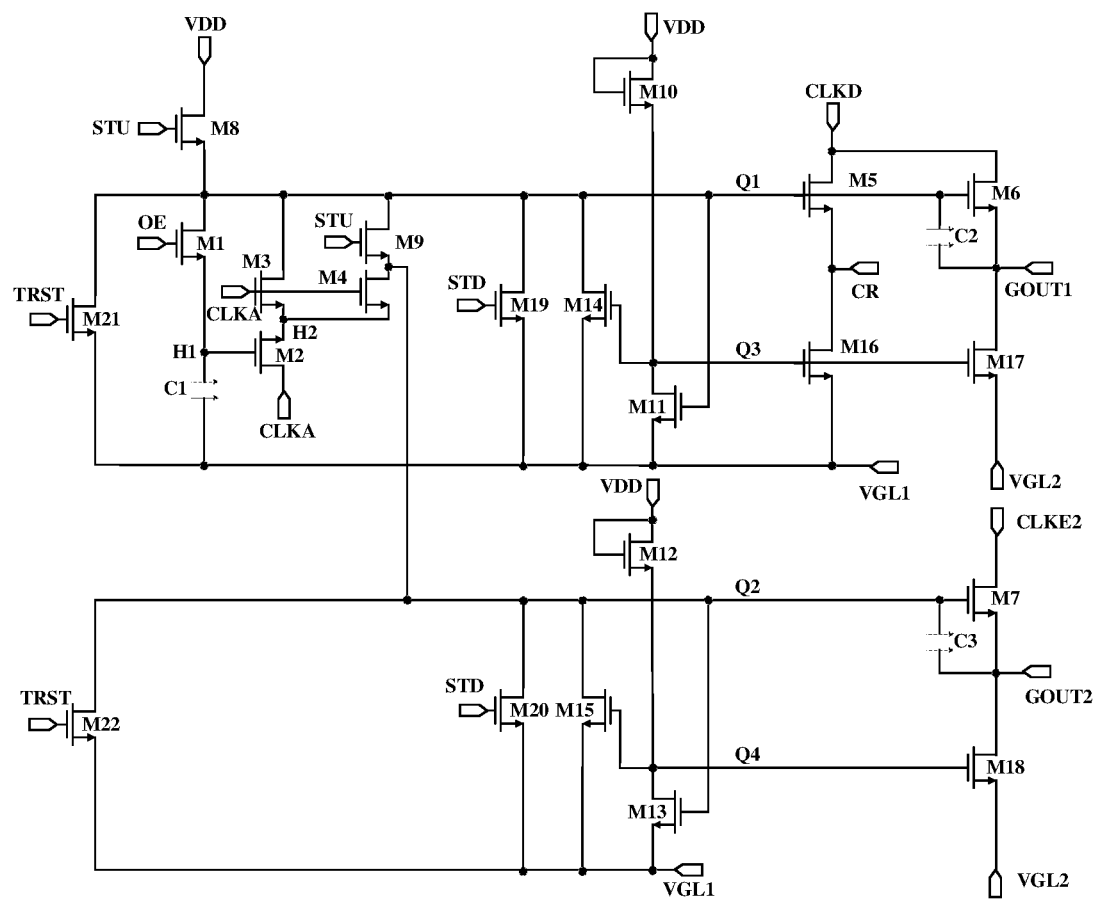
FIG. 7 is a circuit diagram of still another specific implementation example of the shift register unit as shown in FIG. 4.

A gate electrode of the sixth transistor M6 is connected to the first node Q1, a first electrode of the sixth transistor M6 is connected to the third clock signal terminal CLKE1 to receive the third clock signal as the first output signal, and a second electrode of the sixth transistor M6 is connected to the scan signal output terminal GOUT1. For example, a time sequence of the second clock signal CLKD in a display period is identical with a time sequence of the third clock signal CLKE1 in the display period. For example, the time sequence of the third clock signal and the time sequence of the second clock signal in the blanking period may be the same or different, as long as the normal display of the display device is satisfied, the embodiments of the present disclosure do not limit this. For example, in other embodiments, as shown in FIG. 7, the first electrode of the sixth transistor M6 may also be connected to the second clock signal terminal CLKD to receive the second clock signal as the first output signal that is used for the scanning drive of the pixel circuit. It should be noted that the first electrode of the fifth transistor M5 and the first electrode of the sixth transistor M6 are respectively connected to different clock signal terminals, which can avoid that in the case where the sense scan signal needs to be output during the blanking period, the shift output terminal CR also outputs a high level, which causes the first node Q1 and the second node Q2 of the next stage of shift register unit connected to the shift output terminal CR to be charged to a high level, thereby causing an erroneous output of the display panel.

A first electrode of the second capacitor C2 is connected to the first node Q1, and a second electrode of the second capacitor C2 is connected to the second electrode of the sixth transistor M6 (or fifth transistor M5).

The second output circuit 142 includes a seventh transistor M7 and a third capacitor C3. A gate electrode of the seventh transistor M7 is connected to the second node Q2, a first electrode of the seventh transistor M7 is connected to the fourth clock signal terminal CLKE2 to receive the fourth clock signal as the second output signal, and a second electrode of the seventh transistor is connected to the second output terminal GOUT2. A first electrode of the third capacitor C3 is connected to the second node Q2, and a second electrode of the third capacitor C3 is connected to the second output terminal GOUT2.

The first control circuit 120 includes a ninth transistor M9. A gate electrode of the ninth transistor M9 is connected to the input terminal STU to receive an input signal, a first electrode of the ninth transistor M9 is connected to the first node Q1, and a second electrode of the ninth transistor M9 is connected to the second node Q2.

The first control sub-circuit 131 includes a first transistor M1 and a first capacitor C1, the second control sub-circuit 132 includes a second transistor M2, and the third control sub-circuit 133 includes a third transistor M3 and a fourth transistor M4.

A gate electrode of the first transistor M1 is connected to the selection control terminal OE to receive the selection control signal, a first electrode of the first transistor M1 is connected to the first node Q1, and a second electrode of the first transistor M1 is connected to the first blanking node HE A first electrode of the first capacitor C1 is connected to the first blanking node H1, and a second electrode of the first capacitor C1 is connected to the first voltage terminal VGL1 to receive the first voltage.

A gate electrode of the second transistor M2 is connected to the first blanking node H1, a first electrode of the second transistor M2 is connected to the first clock signal terminal CLKA to receive the first clock signal, and a second electrode of the second transistor M2 is connected to the second blanking node H2.

A gate electrode of the third transistor M3 is connected to the first clock signal terminal CLKA to receive the first clock signal, a first electrode of the third transistor M3 is connected to the second blanking node H2, and a second electrode of the third transistor M3 is connected to the first node Q2. A gate electrode of the fourth transistor M4 is connected to the first clock signal terminal CLKA to receive the first clock signal, a first electrode of the fourth transistor M4 is connected to the second blanking node H2, and a second electrode of the fourth transistor M4 is connected to the second node Q2.

The second control circuit 151 includes a tenth transistor M10 and an eleventh transistor M11, and the third control circuit 152 includes a twelfth transistor M12 and a thirteenth transistor M1.

A gate electrode of the tenth transistor M10 is connected to a first electrode of the tenth transistor M10 and is connected to the second voltage terminal VDD to receive the second voltage, and a second electrode of the tenth transistor M10 is connected to the third node Q3. A gate electrode of the eleventh transistor M11 is connected to the first node Q1, a first electrode of the eleventh transistor M11 is connected to the third node Q3, and a second electrode of the eleventh transistor M11 is connected to the first voltage terminal VGL1 to receive the first voltage.

A gate electrode of the twelfth transistor M12 is connected to a first electrode of the twelfth transistor M12 and is connected to the second voltage terminal VDD to receive the second voltage, and a second electrode of the twelfth transistor M12 is connected to the fourth node Q4; a gate electrode of the thirteenth transistor M13 is connected to the second node Q2, a first electrode of the thirteenth transistor M13 is connected to the fourth node Q4, and a second electrode of the thirteenth transistor M13 is connected to the first voltage terminal VGL1 to receive the first voltage.

The first node noise reduction circuit 161 includes a fourteenth transistor M14, and the second node noise reduction circuit 162 includes a fifteenth transistor M15. A gate electrode of the fourteenth transistor M14 is connected to the third node Q3, a first electrode of the fourteenth transistor M14 is connected to the first node Q1, and a second electrode of the fourteenth transistor M14 is connected to the first voltage terminal VGL1 to receive the first voltage. A gate electrode of the fifteenth transistor M15 is connected to the fourth node Q4, a first electrode of the fifteenth transistor M15 is connected to the second node Q2, and a second electrode of the fifteenth transistor M15 is connected to the first voltage terminal VGL1 to receive the first voltage.

For example, in the case where the first output terminal OUT1 includes a shift output terminal CR and a scan signal output terminal GOUT1, the first output noise reduction circuit 171 includes a sixteenth transistor M16 and a seventeenth transistor M17, and the second output noise reduction circuit 172 includes an eighteenth transistor M18.

A gate electrode of the sixteenth transistor M16 is connected to the third node Q3, a first electrode of the sixteenth transistor M16 is connected to the shift output terminal CR, and a second electrode of the sixteenth transistor M16 is connected to the first voltage terminal VGL1 to receive the first voltage. A gate electrode of the seventeenth transistor M17 is connected to the third node Q3, a first electrode of the seventeenth transistor M17 is connected to the scan signal output terminal GOUT1, and a second electrode of the seventeenth transistor M17 is connected to the third voltage terminal VGL2 to receive the third voltage. A gate electrode of the eighteenth transistor M18 is connected to the fourth node Q4, a first electrode of the eighteenth transistor M18 is connected to the second output terminal GOUT2, and a second electrode of the eighteenth transistor M18 is connected to the third voltage terminal VGL2 to receive the third voltage.

The first reset circuit 181 includes a nineteenth transistor M19, and the second reset circuit 182 includes a twentieth transistor M20. A gate electrode of the nineteenth transistor M19 is connected to the first reset terminal STD to receive the first reset signal, a first electrode of the nineteenth transistor M19 is connected to the first node Q1, and a second electrode of the nineteenth transistor M19 is connected to the first voltage terminal VGL1 to receive the first voltage. A gate electrode of the twentieth transistor M20 is connected to the first reset terminal STD to receive the first reset signal, a first electrode of the twentieth transistor M20 is connected to the second node Q2, and the second electrode of the twentieth transistor M20 is connected to the first voltage terminal VGL1 to receive the first voltage.

The first total reset circuit 191 includes a twenty-first transistor M21, and the second total reset circuit 192 includes a twenty-second transistor M22. A gate electrode of the twenty-first transistor M21 is connected to the second reset terminal TRST to receive the second reset signal, a first electrode of the twenty-first transistor M21 is connected to the first node Q1, and a second electrode of the twenty-first transistor M21 is connected to the first voltage terminal VGL1 to receive the first voltage. A gate electrode of the twenty-second transistor M22 is connected to the second reset terminal TRST to receive the second reset signal, a first electrode of the twenty-second transistor M22 is connected to the second node Q2, and a second electrode of the twenty-second transistor M22 is connected to the first voltage terminal VGL1 to receive the first voltage.

As described above, in the shift register unit 10 provided by the embodiments of the present disclosure, the first capacitor C1 can be used to maintain the potential at the first blanking node H1, the second capacitor C2 can be used to maintain the potential at the first node Q1, and the third capacitor C3 can be used to maintain the potential at the second node Q2. The first capacitor C1, the second capacitor C2, and the third capacitor C3 can be capacitor devices manufactured by a process manufacturing, for example, may be implemented by fabricating specific capacitor electrodes, and respective electrodes of the capacitor can be achieved by a metal layer, a semiconductor layer (for example, a doped polysilicon), or the like, or in some examples, by designing circuit wiring parameters, the first capacitor C1, the second capacitor C2, and the third capacitor C3 may also be implemented by parasitic capacitors between the respective devices. The connection manner of the first capacitor C1, the second capacitor C2, and the third capacitor C is not limited to the above-described manner, and may be other suitable connection manners, as long as the levels written into the first blanking node H1, the first node Q1, and the second node Q2 can be stored.

It should be noted that, in some embodiments of the present disclosure, VGL1 represents both the first voltage terminal and the first voltage, VDD represents both the second voltage terminal and the second voltage, and VGL2 represents both the third voltage terminal and the third voltage. The first voltage VGL1 and the third voltage VGL2 are, for example, low levels, and the second voltage VDD is, for example, a high level, for example, the second voltage VDD is greater than the first voltage VGL1 and is also greater than the third voltage VGL2, and the following embodiments are the same as those described herein and similar portions will not be described in detail.

In addition, it should be noted that, in some embodiments of the present disclosure, the high level and the low level are relative. A high level represents a higher voltage range (for example, a high level can adopt 5V, 10V, or other suitable voltage), and a plurality of high levels may be the same or different. Similarly, a low level represents a lower voltage range (for example, a low level may adopt 0V, −5V, −10V, or other suitable voltages), and a plurality of low levels may be the same or different. For example, the minimum value among the high levels is greater than the maximum value among the low levels.

It should be noted that, in some embodiments of the present disclosure, controlling a level of a node (e.g., the first node Q1, etc.) comprises charging the node to raise the level of the node, or discharging the node to decrease the level of the node. For example, a capacitor electrically connected to the node may be set, and charging the node means charging the capacitor electrically connected to the node; similarly, discharging the node means discharging the capacitor electrically connected to the node; the capacitor can maintain the high level or low level of the node.

It should be noted that in the present disclosure, GOUT1 represents both the scan signal output terminal and the first output signal, GOUT2 represents both the second output terminal and the second output signal, CLKA represents the first clock signal terminal and the first clock signal, CLKD represents the second clock signal terminal and the second clock signal, CLKE1 represents the third clock signal terminal and the third clock signal, CLKE2 represents the fourth clock signal terminal and the fourth clock signal, and the following embodiments are the same as those described herein and similar portions will not be described in detail.

In the embodiments of the present disclosure, for example, in the case where the respective circuits are implemented as N-type transistors, the term "pull up" means charging a node or an electrode of a transistor such that an absolute value of a level of the node or a level of the electrode increases, thereby achieving an operation of a corresponding transistor (e.g., turn on); and the term "pull down" means discharging a node or an electrode of a transistor such that an absolute value of a level of the node or a level of the electrode is reduced, thereby achieving an operation of a corresponding transistor (e.g., turn off).

For another example, in the case where the respective circuits are implemented as P-type transistors, the term "pull up" means discharging a node or an electrode of a transistor such that an absolute value of a level of the node or a level of the electrode is reduced to achieve an operation of a corresponding transistor (e.g., turn on); and the term "pull down" means charging a node or an electrode of a transistor such that an absolute value of a level of the node or a level of the electrode increases to achieve an operation of a corresponding transistor (e.g., turn off).

It should be noted that in the description of various embodiments of the present disclosure, the first node Q1, the second node Q2, the third node Q3, and the fourth node Q4, the first blanking node H1, and the second blanking node H2 do not indicate actual components, but indicate junction points of related electrical connections in the circuit diagram.

The transistors used in the embodiments of the present disclosure may all be thin film transistors, field effect transistors, or other switching devices with the like characteristics, and the embodiments of the present disclosure can be described by taking the thin film transistors as an example. A source electrode and a drain electrode of a transistor used here can be symmetrical in structure, so the source electrode and the drain electrode of the transistor may have no difference in structure. In the embodiments of the present disclosure, in order to distinguish two electrodes of a transistor except a gate electrode, one of the two electrodes is directly referred to as a first electrode, and the other of the two electrodes is directly referred to as a second electrode. In addition, the transistors can be divided into N-type transistors and P-type transistors according to characteristics of the transistors. In the case where the transistor is a P-type transistor, the turn-on voltage is a low level voltage (for example, 0V, −5V, −10V, or other suitable voltage), and the turn-off voltage is a high level voltage (for example, 5V, 10V, or other suitable voltage); in the case where the transistor is an N-type transistor, the turn-on voltage is a high level voltage (for example, 5V, 10V, or other suitable voltage), and the turn-off voltage is a low level voltage (for example, 0V, −5V, −10V, or other suitable voltage).

In addition, the transistors in the embodiments of the present disclosure are all described by taking N-type transistors as an example. In this case, a first electrode of each transistor is a drain electrode, and a second electrode of each transistor is a source electrode. It should be noted that the present disclosure includes but is not limited to this case. For example, one or more transistors in the shift register unit 10 provided by the embodiment of the present disclosure may also adopt P-type transistors. In this case, a first electrode of each transistor is a source electrode, a second electrode of each transistor is a drain electrode, as long as respective electrodes of a selected-type transistor are correspondingly connected in accordance with respective electrodes of a corresponding transistor in the embodiment of the present disclosure, and the corresponding voltage terminals provide corresponding high voltages or low voltages. In the case where an n-type transistor is used, Indium Gallium Zinc Oxide (IGZO) can be used as an active layer of the thin film transistor, which may effectively reduce the size of the transistor and prevent leakage current compared with a case of using Low Temperature Poly Silicon (LTPS) or amorphous silicon (such as hydrogenated amorphous silicon) as the active layer of the thin film transistor.

Figure 8:
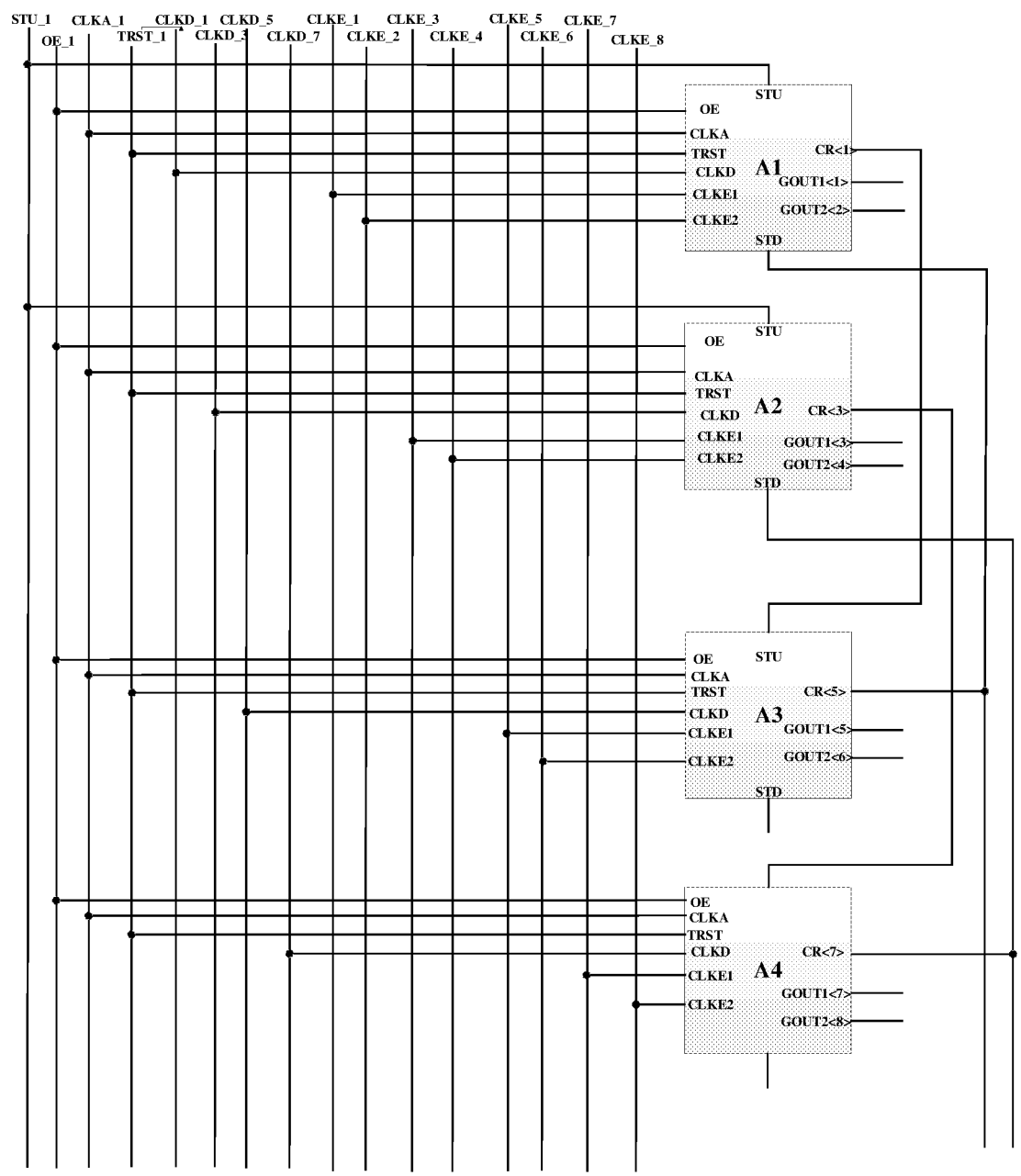
FIG. 8 is a schematic diagram of a gate driving circuit provided by at least one embodiment of the present disclosure.

At least one embodiment of the present disclosure also provides a gate driving circuit 20, as shown in FIG. 8, the gate driving circuit 20 includes a plurality of cascaded shift register units 10, and any one or more of the shift register units 10 may adopt the structure of the shift register unit 10 provided in any embodiment of the present disclosure or a modification thereof. For example, in the example shown in FIG. 8, the shift register unit 10 is described by adopting the structure of the shift register unit 10 shown in FIG. 7 as an example, A1, A2, A3, and A4 in FIG. 8 represent four cascaded shift register units 10, respectively.

For example, as shown in FIG. 8, each shift register unit 21 includes a scan signal output terminal GOUT1, a second output terminal GOUT2, and a shift output terminal CR, so as to output a first output signal (including a shift signal CR and a scan output signal GOUT1) and a second output signal GOUT2, respectively. It should be noted that, for clarity and conciseness, the scan output signal GOUT1 is hereinafter referred to as the first output signal.

In the case where the gate driving circuit 20 is used to drive a plurality of rows of sub-pixel units in the display panel 10, the first output signal GOUT1 may drive one row of sub-pixel units in the display panel 10 and the second output signal GOUT2 may drive one row of sub-pixel units in the display panel 10. For example, the scan signal output terminal GOUT1<1> and the second output terminal GOUT2<2> in the first stage of shift register unit A1 can respectively drive sub-pixel units in a first row and sub-pixel units in a second row in the display panel 10 through gate lines connected to the scan signal output terminal GOUT1<1> and the second output terminal GOUT2<2>, respectively, the scan signal output terminal GOUT1<3> and the second output terminal GOUT2<4> in a second stage of shift register unit A2 can respectively drive sub-pixel units in a third row and sub-pixel units in a fourth row in the display panel 10 through gate lines connected to the scan signal output terminal GOUT1<3> and the second output terminal GOUT2<4>, respectively, and so on.

For clarity and conciseness, for example, in FIG. 8, CR<1> represents the shift output terminal of the first stage of shift register unit, CR<3> represents the shift output terminal of the second stage of shift register unit, CR<5> represents a shift output terminal of a third stage of shift register unit, and CR<7> represents a shift output terminal of a fourth stage of shift register unit, and so on.

For example, as shown in FIG. 8, the gate driving circuit 20 includes a first sub-clock signal line CLKD_1, a second sub-clock signal line CLKD_3, a third sub-clock signal line CLKD_5, and a fourth sub-clock signal line CLKD_7. For example, the second clock signal terminal CLKD in a (4k−3)-th stage (k is an integer greater than zero) shift register unit is connected to the first sub-clock signal line CLKD_1 to receive the second clock signal CLKD of the (4k−3)-th stage of shift register unit; the second clock signal terminal CLKD in a (4k−2)-th stage of shift register unit is connected to the second sub-clock signal line CLKD_3 to receive the second clock signal CLKD of the (4k−2)-th stage of shift register unit; the second clock signal terminal CLKD in a (4k−1)-th stage of shift register unit is connected to the third sub-clock signal line CLKD_5 to receive the second clock signal CLKD of the (4k−1)-th stage of shift register unit; and the second clock signal terminal CLKD in a (4k)-th stage of shift register unit is connected to the fourth sub-clock signal line CLKD_7 to receive the second clock signal CLKD of the (4k)-th stage of shift register unit.

As described above, in the case where the shift register units 10 are cascaded, it is only necessary to provide the second clock signal to the second clock signal terminal CLKD in each stage of shift register unit 10, and the second clock signal may be output as the shift signal CR to complete the scan shift.

As shown in FIG. 8, the gate driving circuit 20 further includes a fifth sub-clock signal line CLKE_1 to a twelfth sub-clock signal line CLKE_8.

The third clock signal terminal CLKE1 in the (4k−3)-th stage of shift register unit is connected to the fifth sub-clock signal line CLKE_1 to receive the third clock signal CLKE1 of the (4k−3)-th stage of shift register unit, and the fourth clock signal terminal CLKE2 in the (4k−3)-th stage of shift register unit is connected to the sixth sub-clock signal line CLKE_2 to receive the fourth clock signal CLKE2 of the (4k−3)-th stage of shift register unit.

The third clock signal terminal CLKE1 in the (4k−2)-th stage of shift register unit is connected to the seventh sub-clock signal line CLKE_3 to receive the third clock signal CLKE1 of the (4k−2)-th stage of shift register unit, and the fourth clock signal terminal CLKE2 in the (4k−2)-th stage of shift register unit is connected to the eighth sub-clock signal line CLKE_4 to receive the fourth clock signal CLKE2 of the (4k−2)-th stage of shift register unit.

The third clock signal terminal CLKE1 in the (4k−1)-th stage of shift register unit is connected to the ninth sub-clock signal line CLKE_5 to receive the third clock signal CLKE1 of the (4k−1)-th stage of shift register unit, and the fourth clock signal terminal CLKE2 in the (4k−1)-th stage of shift register unit is connected to the tenth sub-clock signal line CLKE_6 to receive the fourth clock signal CLKE2 of the (4k−1)-th stage of shift register unit.

The third clock signal terminal CLKE1 in the (4k)-th stage of shift register unit is connected to the eleventh sub-clock signal line CLKE_7 to receive the third clock signal CLKE1 of the (4k)-th stage of shift register unit, and the fourth clock signal terminal CLKE2 in the (4k)-th stage of shift register unit is connected to the twelfth sub-clock signal line CLKE_8 to receive the fourth clock signal CLKE2 of the (4k)-th stage of shift register unit.

As described above, the drive signals (the specific signal timing can refer to FIG. 9) outputted row by row are provided to the shift register units 10 in respective stages through a total of eight sub-clock signal lines, that is, the fifth sub-clock signal line CLKE_1 to the twelfth sub-clock signal line CLKE_8. That is, the gate driving circuit 20 provided by the embodiments of the present disclosure may adopt clock signals of 8 CLK, so that the waveforms of the driving signals output by the gate driving circuit 20 may overlap, for example, the pre-charging time of each row of sub-pixel units may be increased, so that the gate driving circuit 20 can be applied to high-frequency scanning display. It should be noted that an amount of signal lines may be 10, 12, 14, or more, which is not limited in the embodiments of the present disclosure.

As shown in FIG. 8, the gate driving circuit 20 further includes a thirteenth sub-clock signal line CLKA_1, a total reset signal line TRST_1, a selection control signal line OE_1, and a trigger signal line STU_1.

As shown in FIG. 8, in the embodiment, the trigger signal line STU_1 is connected to the input terminal STU of the first stage of shift register unit A1 and the input terminal STU of the second stage of shift register unit A2 to provide the input signal STU, and the total reset signal line TRST_1 is connected to the second reset terminals TRST of the shift register units 10 in respective stages to provide a global reset signal TRST. The selection control signal line OE_1 is connected to the selection control terminals OE of the shift register units 10 in respective stages to receive the selection control signal, and the thirteenth sub-clock signal line CLKA_1 is connected to the first clock signal terminals CLKA of the shift register units 10 in respective stages to receive the first clock signal.

As shown in FIG. 8, in addition to the first stage of shift register unit 10 and the second stage of shift register unit 10, an input terminal STU of a remaining stage of shift register units 10 is connected to the shift output terminal CR of a previous stage of shift register unit 10 separated by one stage from the remaining stage of shift register unit 10 to receive the shift signal CR as the input signal STU. In addition to the last two stages of shift register units 10, a first reset terminal STD of the remaining stage of shift register unit 10 is connected to the shift output terminal CR of a next stage of shift register unit 10 separated by one stage form the remaining stage of shift register unit 10 to receive the shift signal CR as the first reset signal STD.

It should be noted that the cascading relationship shown in FIG. 8 is only an example. According to the description of the present disclosure, other cascading manners can also be used according to the actual situation, which is not limited by the embodiments of the present disclosure.

In addition, it should also be noted that, for clarity and conciseness, FIG. 8 only schematically shows the first stage of shift register unit A1, the second stage of shift register unit A2, the third stage of shift register unit A3, and the fourth stage of shift register unit A4, the gate driving circuit 20 further includes a plurality of shift register units 10 that are cascaded in sequence, the embodiments of the present disclosure are not limited thereto, and for the cascading manner of the plurality of shift register units 10, reference may be made to the cascading manner described above, and details are not described herein again.

For example, the gate driving circuit 20 further includes a plurality of voltage lines to provide a plurality of voltage signals to the respective shift register units, for example, the plurality of voltage signals include a high-level signal VDD and low-level signals VGL1, VGL2, and so on.

For example, in the case where the gate driving circuit 20 is used to drive a display panel, the gate driving circuit 20 may be disposed on one side of the display panel. For example, the display panel includes a plurality of rows of gate lines, and the scan signal output terminals GOUT1 and the second output terminals GOUT2 of the shift register units of respective stages in the gate driving circuit 20 can be configured to be sequentially connected to the plurality of rows of gate lines for outputting drive signals. Of course, the gate driving circuit 20 may also be provided on both sides of the display panel to achieve bilateral driving. The embodiments of the present disclosure are not limited to the manner of setting the gate driving circuit 20.

Figure 9:
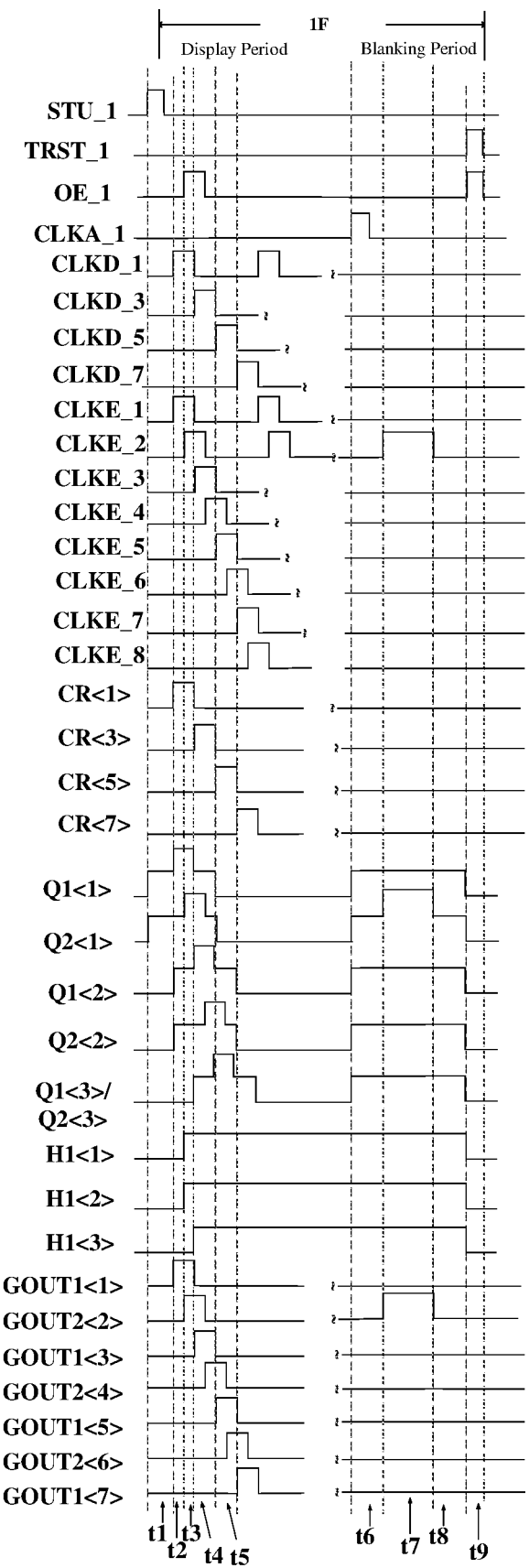
FIG. 9 is a signal timing diagram corresponding to an operation process of the gate driving circuit as shown in FIG. 8 provided by at least one embodiment of the present disclosure.

For example, in some examples, the shift register unit 10 in the gate driving circuit 20 shown in FIG. 8 may adopt the circuit structure as shown in FIG. 5, and FIG. 9 shows a signal timing diagram when the gate driving circuit 20 shown in FIG. 8 is in operation.

In FIG. 9, H1<1>, H1<2>, and H1<3> represent a first blanking node in the first stage of shift register unit A1, a first blanking node in the second stage of shift register unit A2, and a first blanking node in the third stage of shift register unit A3, respectively.

Q1<1> represents the first node in the first stage of shift register unit A1, and controls the output of the scan signal output terminal GOUT1<1> of the first stage of shift register unit A1, Q2<1> represents the second node in the first stage of shift register unit A1, and controls the output of the second output terminal GOUT2<2> of the first stage of shift register unit A1; Q1<2> represents the first node in the second stage of shift register unit A2, and controls the output of the scan signal output terminal GOUT1<3> of the second stage of shift register unit A2, Q2<2> represents the second node in the second stage of shift register unit A2, and controls the output of the second output terminal GOUT2<4> of the second stage of shift register unit A2; Q1<3> represents the first node in the third stage of shift register unit A3, and controls the output of the scan signal output terminal GOUT1<5> of the third stage of shift register unit A3, and Q2<3> represents the second node in the third stage of shift register unit A3, and controls the output of the second output terminal GOUT2<6> of the third stage of shift register unit A3. The number in the angle brackets indicates the number of stages of the shift register unit corresponding to the node, and the following embodiments are the same as those described herein and similar portions will not be repeated.

GOUT1<1> represents the scan signal output terminal of the first stage of shift register unit A1 and the first output signal output by the scan signal output terminal of the first stage of shift register unit A1, and GOUT2<2> represents the second output terminal of the first stage of shift register unit A1 and the second output signal output by the second output terminal of the first stage of shift register unit A1. Similarly, GOUT1<3> represents the scan signal output terminal of the second stage of shift register unit A2 and the first output signal output by the scan signal output terminal of the second stage of shift register unit A2, and GOUT2<4> represents the second output terminal of the second stage of shift register unit A2 and the second output signal output by the second output terminal of the second stage of shift register unit A2, GOUT1<5> represents the scan signal output terminal of the third stage of shift register unit A3 and the first output signal output by the scan signal output terminal of the third stage of shift register unit A3, and GOUT2<6> represents the second output terminal of the third stage of shift register unit A3 and the second output signal output by the second output terminal of the third stage of shift register unit A3, GOUT1<7> represents the scan signal output terminal of the fourth stage of shift register unit A4 and the first output signal output by the scan signal output terminal of the fourth stage of shift register unit A4. The number in the angle brackets indicates the number of rows of a sub-pixel unit, which corresponds to the output terminal, in the display panel, and the following embodiments are the same as those described herein and similar portions will not be repeated.

CR<1> represents the shift signal of the first stage of shift register unit, CR<3> represents the shift signal of the second stage of shift register unit, CR<5> represents the shift signal of the third stage of shift register unit, CR<7> represents the shift signal of the fourth stage of shift register unit, and so on. The number in the angle brackets indicates the number of rows of a sub-pixel unit, which corresponds to the output terminal, in the display panel, and the following embodiments are the same as those described herein and similar portions will not be repeated.

1F represents a first frame and includes a display period and a blanking period, the display period is used to drive the display panel to display, and the blanking period is used to compensate the pixel circuits in the display panel. The signal level in the signal timing diagram shown in FIG. 9 is only schematic and does not represent the true level value.

The working principle of the gate driving circuit 20 shown in FIG. 8 will be described below with reference to the signal timing diagram in FIG. 9 and the shift register unit 10 shown in FIG. 5.

In the display period of the first frame 1F, the working process for the first stage of shift register unit A1 is described as follows.

In a first phase t1, the trigger signal line provides a high level, a high level are input to the input terminal STU of the first stage of shift register unit and the input terminal STU of the second stage of shift register unit, and the eighth transistor M8 and the ninth transistor M9 are turned on, and therefore, the high level input from the second voltage terminal VDD can charge the first node Q1<1> through the eighth transistor M8, so that the first node Q1<1> is pulled up to a first high level and is held by the second capacitor C2. At the same time, because the ninth transistor M9 is turned on, the second node Q2<1> is connected to the first node Q1<1>, and thus, the second node Q2<1> is also pulled up to the first high level and is stored by the third capacitor C3.

In this phase, the fifth transistor M5 and the sixth transistor M6 are turned on under the control of the first node Q1<1>, however, because low level signals are input to the second clock signal terminal CLKD (connected to the first sub-clock signal line CLKD_1) and the third clock signal terminal CLKE1 (connected to the fifth sub-clock signal line CLKE_1) in this phase, both the shift output terminal CR<1> and the scan signal output terminal GOUT1<1> output low level signals. The seventh transistor M7 is turned on under the control of the second node Q2<1>, but because a low level signal is input to the fourth clock signal terminal CLKE2 (connected to the sixth sub-clock signal line CLKE_2) in this phase, the second output terminal GOUT2<2> outputs a low level signal.

In this phase, the pre-charging of the first node Q1<1> and the pre-charging of the second node Q2<1> are completed.

The working principle of the second stage of shift register unit in this phase is similar to those described above, and will not be repeated here.

In a second phase t2, high level signals are input to the second clock signal terminal CLKD (connected to the first sub-clock signal line CLKD_1) and the third clock signal terminal CLKE1 (connected to the fifth sub-clock signal line CLKE_1), the potential of the first node Q1<1> is further pulled up to a second high level due to the bootstrap effect of the second capacitor C2, so the fifth transistor M5 and the sixth transistor M6 remain on, so that both the shift output terminal CR<1> and the scan signal output terminal GOUT1<1> output high level signals.

For example, the high level signal output from the shift output terminal CR<1> can be used for the scanning shift of the upper and lower shift register units, for example, is used as a reset signal of the previous stage of shift register unit or an input signal of the next stage of shift register unit, and the high level signals output from the scan signal output terminal GOUT1<1> and the second output terminal OUT2 can be used to drive sub-pixel units in the first row and sub-pixel units in the second row in the display panel for display.

In a third phase t3, high level signals are input to the second clock signal terminal CLKD, the third clock signal terminal CLKE1, and the fourth clock signal terminal CLKE2 (connected to the sixth sub-clock signal line CLKE_2), the first node Q1<1> continues to be maintained at a high level, so that both the shift output terminal CR<1> and the scan signal output terminal GOUT1<1> output high level signals. At the same time, because the fourth clock signal terminal CLKE2 inputs a high level signal, the potential of the second node Q2<1> is further pulled up to the second high level due to the bootstrap effect of the third capacitor C3, and therefore, the seventh transistor M7 remains to be turned on, so that the second output terminal GOUT2<2> outputs a high level signal.

In this phase, the selection control signal line OE_1 provides a high level. Therefore, a high level is input to the selection control terminal OE of each stage of the shift register units, and therefore, the first transistor M1 is turned on, so that the first node Q1<1> and the first blanking node H1<1> are connected, because the first node Q1<1> is at a high level in this phase, the first blanking node H1<1> is also pulled up to a high level that is stored by the first capacitor C1. The pull-up process of the first blanking node H1<1> of the second stage of shift register unit is similar to those described above, and will not be described in detail.

In a fourth phase t4, low level signals are input to the second clock signal terminal CLKD and the third clock signal terminal CLKE1. Because the first node Q1<1> remains high at this phase, the fifth transistor M5 and the sixth transistor M6 remains on, so that both the shift output terminal CR<1> and the scan signal output terminal GOUT1<1> output low level signals. Due to the bootstrap effect of the second capacitor C2, the potential of the first node Q1<1> will also decrease.

In a fifth phase t5, because the first reset terminal STD of the first stage of shift register unit A1 and the shift output terminal CR<5> of the third stage of shift register unit A3 are connected, in this case, the shift output terminal CR<5> of the third stage of shift register unit A3 outputs a high level, so a high level is input to the first reset terminal STD of the first stage of shift register unit A1, the nineteenth transistor M19 and the twentieth transistor M20 are turned on, the first node Q1<1> and the second node Q2<1> are pulled down to a low level, thereby completing the reset of the first node Q1<1> and the reset of the second node Q2<1>. Because the first node Q1<1> and the second node Q2<1> are at a low level, the eleventh transistor M11 and the thirteenth transistor M13 are turned off, at the same time, the high level input from the second voltage terminal can pull up the third node Q3<1> and the fourth node Q4<1>, and the third node Q3<1> and the fourth node Q4<1> are pulled up to a high level, and therefore, the fourteenth transistor M14 and the fifteenth transistor M15 are turned on to further reset the first node Q1<1> and the second node Q2<1>. In this case, the sixteenth transistor M16, the seventeenth transistor M17, and the eighteenth transistor M18 are also turned on, so that the shift output terminal CR<1>, the scan signal output terminal GOUT1<1>, and the second output terminal GOUT2<2> can be further pulled down and reset.

The first stage of shift register unit drives the sub-pixels in the first row and the sub-pixels in the second row in the display panel to complete the display, and so on, and the second stage of shift register unit, the third stage of shift register unit, and other shift register unit drive the sub-pixel units in the display panel row by row to completes the display driving of one frame. And thus, the display period of one frame ends.

For example, the high potential of the first blanking node H1<1> may be maintained until the blanking period of the first frame 1F. In the following embodiments, taking the case where the sub-pixel unit in the second row needs to be compensated in the first frame 1F as an example, the following operations are performed in the blanking period of the first frame 1F.

In a sixth phase t6, due to the high potential of the first blanking node H1<1>, the second transistor M2 is turned on, so that the first clock signal terminal CLKA is connected to the second blanking node H2<1>. In this phase, the thirteenth sub-clock signal line CLKA_1 provides a high level, because the first clock signal terminal CLKA is connected to the thirteenth sub-clock signal line CLKA_1, the input of the first clock signal terminal CLKA is a high level in this phase, so that in this phase, the second blanking node H2<1> is at a high level, at the same time, the third transistor M3 and the fourth transistor M4 are both turned on in response to the high level received by the first clock signal terminal CLKA, so that the second blanking node H2<1> is connected to the first node Q1<1> and the second node Q2<2>, thereby pulling up the first node Q1<1> and the second node Q2<2> to the first high level.

In a seventh phase t7, the sixth sub-clock signal line CLKE_2 provides a high level, and a high level signal is input to the fourth clock signal terminal CLKE2 (connected to the sixth sub-clock signal line CLKE_2) of the first stage of shift register unit A1, the potential of the second node Q2<1> is further pulled up to the second level due to the bootstrap effect of the third capacitor C3, and the seventh transistor M7 of the first stage of shift register unit A1 is turned on, and the high level signal input from the fourth clock signal terminal CLKE2 of the first stage of shift register unit A1 may be output to the second output terminal GOUT2<2>. For example, in this phase, the signal output from the second output terminal GOUT2<2> can be used to drive the sense transistor in the sub-pixel unit in the display panel to achieve external compensation.

In an eighth phase t8, the signals input from the second clock signal terminal CLKD (connected to the first sub-clock signal line CLKD_1), the third clock signal terminal CLKE1 (connected to the fifth sub-clock signal line CLKE_1), and the fourth clock signal terminal CLKE2 (connected to the sixth sub-clock signal line CLKE_2) of the first stage of shift register unit A1 changes from a high level to a low level, the potential of the second node Q2<2> is pulled down to the first high level due to the bootstrap effect of the third capacitor C3.

In a ninth phase t9, the selection control signal line OE_1 and the total reset signal line TRST_1 provide high levels, because the selection control terminals OE of the shift register units of respective stages are connected to the selection control signal line OE_1, and the second reset terminals TRST of the shift register units of respective stages are connected to the total reset signal line TRST_1, the first blanking nodes H1, the first nodes Q1, and the second nodes Q2 of the shift register units of respective stages can be reset.

So far, the driving timing of the first frame ends. For the subsequent driving of the gate driving circuit in the second frame, the third frame, etc., reference may be made to the above description, and similar portions will not be repeated here.

It should be noted that in the above description of the working principle of random compensation, the case where the blanking period of the first frame 1F outputs driving signals corresponding to the sub-pixel units of the first row and the sub-pixel units of the second row in the display panel is taken as an example to describe, the embodiments of the present disclosure are not limited thereto. For example, in the case where the drive signals corresponding to sub-pixel units in an (n)-th row and sub-pixel units in an (n+1)-th row in the display panel need to be output in the blanking period of a certain frame, in the blanking period of the certain frame, the potentials of the first node Q1 and the second node Q2 of a (n/2)-th stage of shift register unit need to be pulled up to a high level, and at the same time, in the blanking period of the certain frame, a high level signal is input through the third clock signal terminal CLKE1 or the fourth clock signal terminal CLKE2 of the (n/2)-th stage of shift register unit, n is an even number greater than zero.

In addition, in the embodiments of the present disclosure, the time sequence of the two signals being the same indicates that the time when the two signals are at a high level is synchronized, and does not require that the two signals have the same amplitude.

Figure 10:
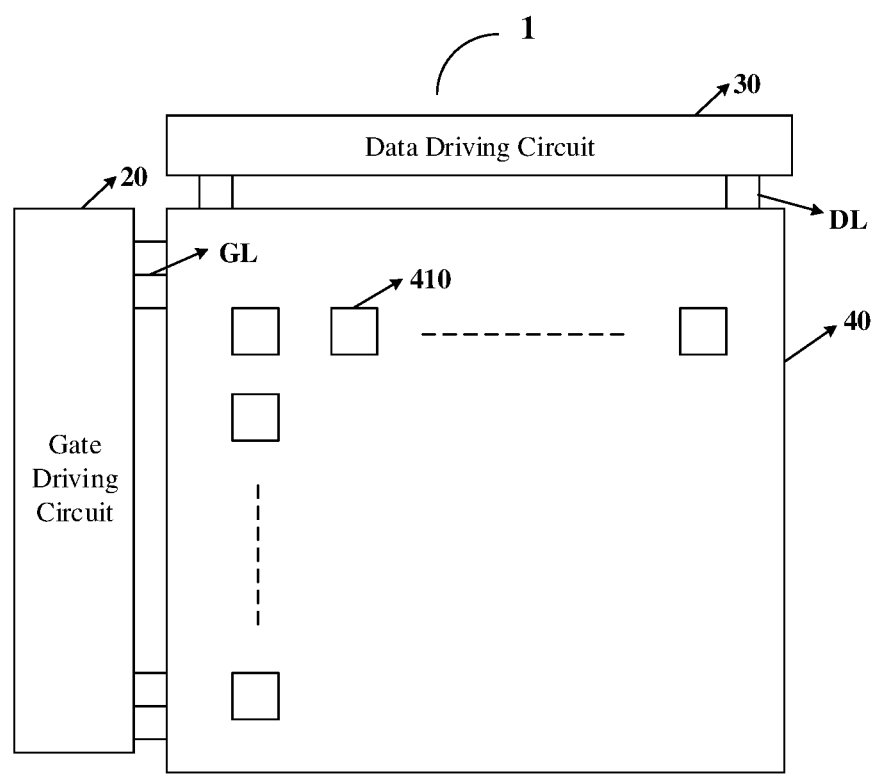
FIG. 10 is a schematic diagram of a display device provided by at least one embodiment of the present disclosure.

At least one embodiment of the present disclosure also provides a display device 1. As shown in FIG. 10, the display device 1 includes a gate driving circuit 20 and a plurality of sub-pixel units 410 arranged in an array. For example, the display device 1 further includes a display panel 40, and a pixel array composed of the plurality of sub-pixel units 410 is disposed in the display panel 40.

The scan signal output terminal GOUT1 of the first output terminal OUT1 and the second output terminal GOUT2 in each shift register unit 10 in the gate driving circuit 20 are electrically connected to different rows of sub-pixel units 410, for example, the gate driving circuit 20 is electrically connected to the sub-pixel unit 410 through the gate line GL. The gate driving circuit 20 is used to provide a driving signal to the pixel array. For example, the driving signal can drive the scan transistor and the sense transistor in the sub-pixel unit 410.

For example, the display device 1 may further include a data driving circuit 30 for providing data signals to the pixel array. For example, the data driving circuit 30 is electrically connected to the sub-pixel unit 410 through the data line DL.

It should be noted that the display device 1 in the embodiment may be any product or component with a display function such as a liquid crystal panel, a liquid crystal TV, a display, an OLED panel, an OLED TV, an electronic paper display device, a mobile phone, a tablet computer, a notebook computer, a digital photo frame, a navigator, etc.

For the technical effect of the display device 1 provided by the embodiment of the present disclosure, reference may be made to the corresponding description about the gate driving circuit 20 in the above-mentioned embodiment, and similar portions will not be repeated here.

At least one embodiment of the present disclosure also provides a driving method that can be used to drive the shift register unit 10 provided by the embodiment of the present disclosure, a plurality of the shift register units 10 can be cascaded to constitute a gate driving circuit provided by at least one embodiment of the present disclosure. The gate driving circuit is used to drive a display panel to display at least one frame of pictures. The driving method includes a display period and a blanking period for one frame.

During the display period, the input circuit 110 charges the first node Q1 in response to the input signal input from the input terminal STU, the first control circuit 120 charges the second node Q2 in response to the input signal and the level of the first node Q1, and the blanking control circuit 130 charges the first blanking node H1 of the blanking control circuit 130 under control of the level of the first node Q1; and the first output circuit 141 outputs the first output signal at the first output terminal OUT1 under control of the level of the first node Q1, and the second output circuit 142 outputs the second output signal at the second output terminal OUT2 under control of the level of the second node Q2.

During the blanking period, the blanking control circuit 130 charges the first node Q1 and the second node Q2 under control of the selection control signal, the first clock signal, and the level of the first blanking node H1; and the first output circuit 141 outputs the first output signal at the first output terminal OUT1 under control of the level of the first node Q1, and the second output circuit 142 outputs the second output signal at the second output terminal OUT2 under control of the level of the second node Q2.

It should be noted that for a detailed description and the technical effect of the driving method for driving the shift register unit provided by the embodiments of the present disclosure, reference may be made to the description of the working principles of the shift register unit 10 and the gate driving circuit 20 in the embodiments of the present disclosure, and details will not be repeated here.

What have been described above are only specific implementations of the present disclosure, the protection scope of the present disclosure is not limited thereto, and the protection scope of the present disclosure should be based on the protection scope of the claims.

What is claimed is:

1. A shift register unit, comprising: an input circuit, a first control circuit, a blanking control circuit, a first output circuit, and a second output circuit, wherein the input circuit is electrically connected to an input terminal and a first node, and is configured to control a level of the first node in response to an input signal input from the input terminal;

the first control circuit is electrically connected to the input terminal, the first node, and a second node, and is configured to control a level of the second node in response to the input signal input from the input terminal;

the blanking control circuit is electrically connected to a selection control terminal, a first clock signal terminal, the first node and the second node, and is configured to control the level of the first node and the level of the second node under control of a selection control signal input from the selection control terminal, a first clock signal input from the first clock signal terminal;

the first output circuit comprises a first output terminal and the first node, and the first output circuit is configured to output a first output signal at the first output terminal under control of the level of the first node; and the second output circuit comprises a second output terminal and the second node, and the second output circuit is configured to output a second output signal at the second output terminal under control of the level of the second node.

2. The shift register unit according to claim 1, wherein the blanking control circuit comprises a first control sub-circuit, a second control sub-circuit, and a third control sub-circuit, wherein the first control sub-circuit is electrically connected to the selection control terminal, the first node and a first blanking node, and is configured to control a level of the first blanking node under control of the selection control signal input from the selection control terminal and the level of the first node;

the second control sub-circuit is electrically connected to the first blanking node and a second blanking node, and is configured to control a level of the second blanking node under control of the level of the first blanking node; and the third control sub-circuit is electrically connected to the first clock signal terminal, the second blanking node, the first node, and the second node, and is configured to control the level of the first node and the level of the second node under control of the first clock signal input from the first clock signal terminal.

3. The shift register unit according to claim 2, wherein the first control sub-circuit comprises a first transistor and a first capacitor, the second control sub-circuit comprises a second transistor, and the third control sub-circuit comprises a third transistor and a fourth transistor;

a gate electrode of the first transistor is electrically connected to the selection control terminal to receive the selection control signal, a first electrode of the first transistor is electrically connected to the first node, and a second electrode of the first transistor is electrically connected to the first blanking node;

a first electrode of the first capacitor is electrically connected to the first blanking node, and a second electrode of the first capacitor is electrically connected to a first voltage terminal to receive a first voltage;

a gate electrode of the second transistor is electrically connected to the first blanking node, a first electrode of the second transistor is electrically connected to the first clock signal terminal to receive the first clock signal, and a second electrode of the second transistor is electrically connected to the second blanking node;

a gate electrode of the third transistor is electrically connected to the first clock signal terminal to receive the first clock signal, a first electrode of the third transistor is electrically connected to the second blanking node, and a second electrode of the third transistor is electrically connected to the first node; and a gate electrode of the fourth transistor is electrically connected to the first clock signal terminal to receive the first clock signal, a first electrode of the fourth transistor is electrically connected to the second blanking node, and a second electrode of the fourth transistor is electrically connected to the second node.

4. The shift register unit according to claim 1, wherein the first output terminal comprises a shift output terminal and at least one scan signal output terminal.

5. The shift register unit according to claim 4, wherein in a case where the first output terminal comprises a shift output terminal and a scan signal output terminal, the first output circuit comprises a fifth transistor, a sixth transistor, and a second capacitor;

a gate electrode of the fifth transistor is electrically connected to the first node, a first electrode of the fifth transistor is electrically connected to a second clock signal terminal to receive a second clock signal as the first output signal, and a second electrode of the fifth transistor is electrically connected to the shift output terminal;

a gate electrode of the sixth transistor is electrically connected to the first node, a first electrode of the sixth transistor is electrically connected to a third clock signal terminal to receive a third clock signal as the first output signal, and a second electrode of the sixth transistor is electrically connected to the scan signal output terminal; and a first electrode of the second capacitor is electrically connected to the first node, and a second electrode of the second capacitor is electrically connected to the second electrode of the fifth transistor or the second electrode of the sixth transistor, a time sequence of the second clock signal in a display period is identical with a time sequence of the third clock signal in the display period.

6. The shift register unit according to claim 5, wherein a duration in a case where the third clock signal and the fourth clock signal are simultaneously at a high level is less than or equal to a duration in a case where the third clock signal and the fourth clock signal are neither simultaneously at a high level nor a low level.

7. The shift register unit according to claim 5, wherein the shift output terminal, the first output terminal and the blanking control circuit correspond to a same row of pixel.

8. The shift register unit according to claim 1, wherein the second output circuit comprises a seventh transistor and a third capacitor;

a gate electrode of the seventh transistor is electrically connected to the second node, a first electrode of the seventh transistor is electrically connected to a fourth clock signal terminal to receive a fourth clock signal as the second output signal, and a second electrode of the seventh transistor is electrically connected to the second output terminal; and a first electrode of the third capacitor is electrically connected to the second node, and a second electrode of the third capacitor is electrically connected to the second output terminal.

9. The shift register unit according to claim 1, wherein the input circuit comprises an eighth transistor, a gate electrode of the eighth transistor is electrically connected to the input terminal to receive the input signal, a first electrode of the eighth transistor is electrically connected to a second voltage terminal to receive a second voltage, and a second electrode of the eighth transistor is electrically connected to the first node.

10. The shift register unit according to claim 1, wherein the first control circuit comprises a ninth transistor, a gate electrode of the ninth transistor is electrically connected to the input terminal to receive the input signal, a first electrode of the ninth transistor is electrically connected to the first node, and a second electrode of the ninth transistor is electrically connected to the second node.

11. The shift register unit according to claim 1, further comprising a second control circuit and a third control circuit, wherein the second control circuit is electrically connected to the first node and a third node, and is configured to control a level of the third node under control of the level of the first node; and the third control circuit is electrically connected to the second node and a fourth node, and is configured to control a level of the fourth node under control of the level of the second node.

12. The shift register unit according to claim 11, wherein the second control circuit comprises a tenth transistor and an eleventh transistor, and the third control circuit comprises a twelfth transistor and a thirteenth transistor;

a gate electrode of the tenth transistor is electrically connected to a first electrode of the tenth transistor, and is connected to a second voltage terminal to receive a second voltage, and a second electrode of the tenth transistor is electrically connected to the third node;

a gate electrode of the eleventh transistor is electrically connected to the first node, a first electrode of the eleventh transistor is electrically connected to the third node, and a second electrode of the eleventh transistor is electrically connected to a first voltage terminal to receive a first voltage;

a gate electrode of the twelfth transistor is electrically connected to a first electrode of the twelfth transistor and is electrically connected to the second voltage terminal to receive the second voltage, and a second electrode of the twelfth transistor is electrically connected to the fourth node; and a gate electrode of the thirteenth transistor is electrically connected to the second node, a first electrode of the thirteenth transistor is electrically connected to the fourth node, and a second electrode of the thirteenth transistor is electrically connected to the first voltage terminal to receive the first voltage.

13. The shift register unit according to claim 11, further comprising a first node noise reduction circuit and a second node noise reduction circuit,
  wherein the first node noise reduction circuit is electrically connected to the first node and the third node, and is configured to perform noise reduction on the first node under control of the level of the third node; and
  the second node noise reduction circuit is electrically connected to the second node and the fourth node, and is configured to perform noise reduction on the second node under control of the level of the fourth node.

14. The shift register unit according to claim 13, wherein the first node noise reduction circuit comprises a fourteenth transistor, and the second node noise reduction circuit comprises a fifteenth transistor;
  a gate electrode of the fourteenth transistor is electrically connected to the third node, a first electrode of the fourteenth transistor is electrically connected to the first node, and a second electrode of the fourteenth transistor is electrically connected to a first voltage terminal to receive a first voltage; and
  a gate electrode of the fifteenth transistor is electrically connected to the fourth node, a first electrode of the fifteenth transistor is electrically connected to the second node, and a second electrode of the fifteenth transistor is electrically connected to the first voltage terminal to receive the first voltage.

15. The shift register unit according to claim 11, further comprising a first output noise reduction circuit and a second output noise reduction circuit,
  wherein the first output noise reduction circuit is electrically connected to the third node and the first output terminal, and is configured to perform noise reduction on the first output terminal under the control of the level of the third node; and
  the second output noise reduction circuit is electrically connected to the fourth node and the second output terminal, and is configured to perform noise reduction on the second output terminal under the control of the level of the fourth node.

16. The shift register unit according to claim 15, wherein in a case where the first output terminal comprises a shift output terminal and a scan signal output terminal, the first output noise reduction circuit comprises a sixteenth transistor and a seventeenth transistor, and the second output noise reduction circuit comprises an eighteenth transistors;
  a gate electrode of the sixteenth transistor is electrically connected to the third node, a first electrode of the sixteenth transistor is electrically connected to the shift output terminal, and a second electrode of the sixteenth transistor is electrically connected to a first voltage terminal to receive a first voltage;
  a gate electrode of the seventeenth transistor is electrically connected to the third node, a first electrode of the seventeenth transistor is electrically connected to the scan signal output terminal, and a second electrode of the seventeenth transistor is electrically connected to a third voltage terminal to receive a third voltage; and
  a gate electrode of the eighteenth transistor is electrically connected to the fourth node, a first electrode of the eighteenth transistor is electrically connected to the second output terminal, and a second electrode of the eighteenth transistor is electrically connected to the third voltage terminal to receive the third voltage.

17. The shift register unit according to claim 11, wherein the second control circuit and the third control circuit are also electrically connected to a second voltage terminal to receive a second voltage, and are configured to transmit the second voltage simultaneously to the third node and the fourth node under control of the second voltage.

18. The shift register unit according to claim 1, further comprising a first reset circuit and a second reset circuit,
  wherein the first reset circuit is electrically connected to the first node and a first reset terminal, and is configured to reset the first node in response to a first reset signal provided by the first reset terminal; and
  the second reset circuit is electrically connected to the second node and the first reset terminal, and is configured to reset the second node in response to the first reset signal.

19. The shift register unit according to claim 18, wherein the first reset circuit comprises a nineteenth transistor, and the second reset circuit comprises a twentieth transistor;
  a gate electrode of the nineteenth transistor is electrically connected to the first reset terminal to receive the first reset signal, a first electrode of the nineteenth transistor is electrically connected to the first node, and a second electrode of the nineteenth transistor is electrically connected to a first voltage terminal to receive a first voltage; and
  a gate electrode of the twentieth transistor is electrically connected to the first reset terminal to receive the first reset signal, a first electrode of the twentieth transistor is electrically connected to the second node, and a second electrode of the twentieth transistor is electrically connected to the first voltage terminal to receive the first voltage.

20. The shift register unit according to claim 18, wherein the first reset circuit and the second reset circuit are also electrically connected to a first voltage terminal to receive a first voltage, and are configured to transmit the second voltage simultaneously to the first node and the second node under control of the first reset signal.

21. The shift register unit according to claim 1, further comprising a first total reset circuit and a second total reset circuit,
  wherein the first total reset circuit is electrically connected to the first node and a second reset terminal, and is configured to reset the first node in response to a second reset signal provided by the second reset terminal; and
  the second total reset circuit is electrically connected to the second node and the second reset terminal, and is configured to reset the second node in response to the second reset signal.

22. The shift register unit according to claim 21, wherein the first total reset circuit comprises a twenty-first transistor, and the second total reset circuit comprises a twenty-second transistor;
  a gate electrode of the twenty-first transistor is electrically connected to the second reset terminal to receive the second reset signal, a first electrode of the twenty-first transistor is electrically connected to the first node, and a second electrode of the twenty-first transistor is electrically connected to a first voltage terminal to receive a first voltage; and
  a gate electrode of the twenty-second transistor is electrically connected to the second reset terminal to receive the second reset signal, a first electrode of the twenty-second transistor is electrically connected to the second node, and a second electrode of the twenty-second transistor is electrically connected to the first voltage terminal to receive the first voltage.

23. A display device, comprising a gate driving circuit comprising the shift register unit according to claim 1 and a plurality of sub-pixel units arranged in an array,
wherein the first output terminal and the second output terminal of each shift register unit in the gate driving circuit are electrically connected to different rows of the plurality of sub-pixel units, respectively.

24. A driving method for driving the shift register unit according to claim 1, comprising a display period and a blanking period for one frame,
wherein during the display period,
the input circuit charges the first node in response to the input signal input from the input terminal, the first control circuit charges the second node in response to the input signal and the level of the first node, and the blanking control circuit charges a first blanking node of the blanking control circuit under control of the level of the first node; and
the first output circuit outputs the first output signal at the first output terminal under control of the level of the first node, and the second output circuit outputs the second output signal at the second output terminal under control of the level of the second node;
during the blanking period,
the blanking control circuit charges the first node and the second node under control of the selection control signal, the first clock signal, and a level of the first blanking node; and
the first output circuit outputs the first output signal at the first output terminal under control of the level of the first node, and the second output circuit outputs the second output signal at the second output terminal under control of the level of the second node.

25. The shift register unit according to claim 1, wherein the input circuit and the first control circuit are configured to transmit simultaneously the first input signal to the first node and the second node under control of the first input signal.

26. The shift register unit according to claim 25, wherein the input circuit comprises an eighth transistor,
a gate electrode and a first electrode of the eighth transistor are electrically connected to each other to be electrically connected the input terminal to receive the input signal, and a second electrode of the eighth transistor is electrically connected to the first node.

27. The shift register unit according to claim 1, wherein the first output signal and the second output signal are configured to drive adjacent rows of pixels.

* * * * *